(12) United States Patent
Chang et al.

(10) Patent No.: US 11,317,529 B2
(45) Date of Patent: Apr. 26, 2022

(54) SSD CARRIER BRACKET

(71) Applicant: Quanta Computer Inc., Taoyuan (TW)

(72) Inventors: Chun Chang, Taoyuan (TW);
Shih-Hsuan Hu, Taoyuan (TW);
Wei-Cheng Tseng, Taoyuan (TW)

(73) Assignee: QUANTA COMPUTER INC.,
Taoyuan (TW)

( * ) Notice: Subject to any disclaimer, the term of this patent is extended or adjusted under 35 U.S.C. 154(b) by 0 days.

(21) Appl. No.: 17/156,100

(22) Filed: Jan. 22, 2021

(65) Prior Publication Data

US 2022/0061180 A1    Feb. 24, 2022

Related U.S. Application Data

(60) Provisional application No. 63/068,803, filed on Aug. 21, 2020.

(51) Int. Cl.
*H05K 7/14* (2006.01)
*G06F 1/18* (2006.01)
*H05K 5/02* (2006.01)

(52) U.S. Cl.
CPC ........... *H05K 7/1401* (2013.01); *G06F 1/185* (2013.01); *H05K 5/0247* (2013.01)

(58) Field of Classification Search
CPC ....................................................... G06F 1/187
See application file for complete search history.

(56) References Cited

U.S. PATENT DOCUMENTS 5,499,925 A * 3/1996 Lwee ..................... G06K 13/08
439/157
2016/0255731 A1* 9/2016 Ran ......................... E05B 15/08
361/807

* cited by examiner

*Primary Examiner* — Jerry Wu
(74) *Attorney, Agent, or Firm* — Nixon Peabody LLP

(57) ABSTRACT

A carrier device includes a base bracket, a device bracket, a lever, and a cable holder. The device bracket is coupled to the base bracket and is movable between an initial device bracket position and a final device bracket position. The lever is coupled to the base bracket and is movable between an initial lever position and a final lever position. The lever is configured to move from the initial lever position toward the final lever position in response to the device bracket moving from the initial device bracket position to the final device bracket position. The cable holder is coupled to the base bracket and the lever. The cable holder is configured to hold one or more cables. The cable holder is further configured to move from an initial cable holder position to a final cable holder position, in response to the lever moving to the final lever position.

20 Claims, 17 Drawing Sheets

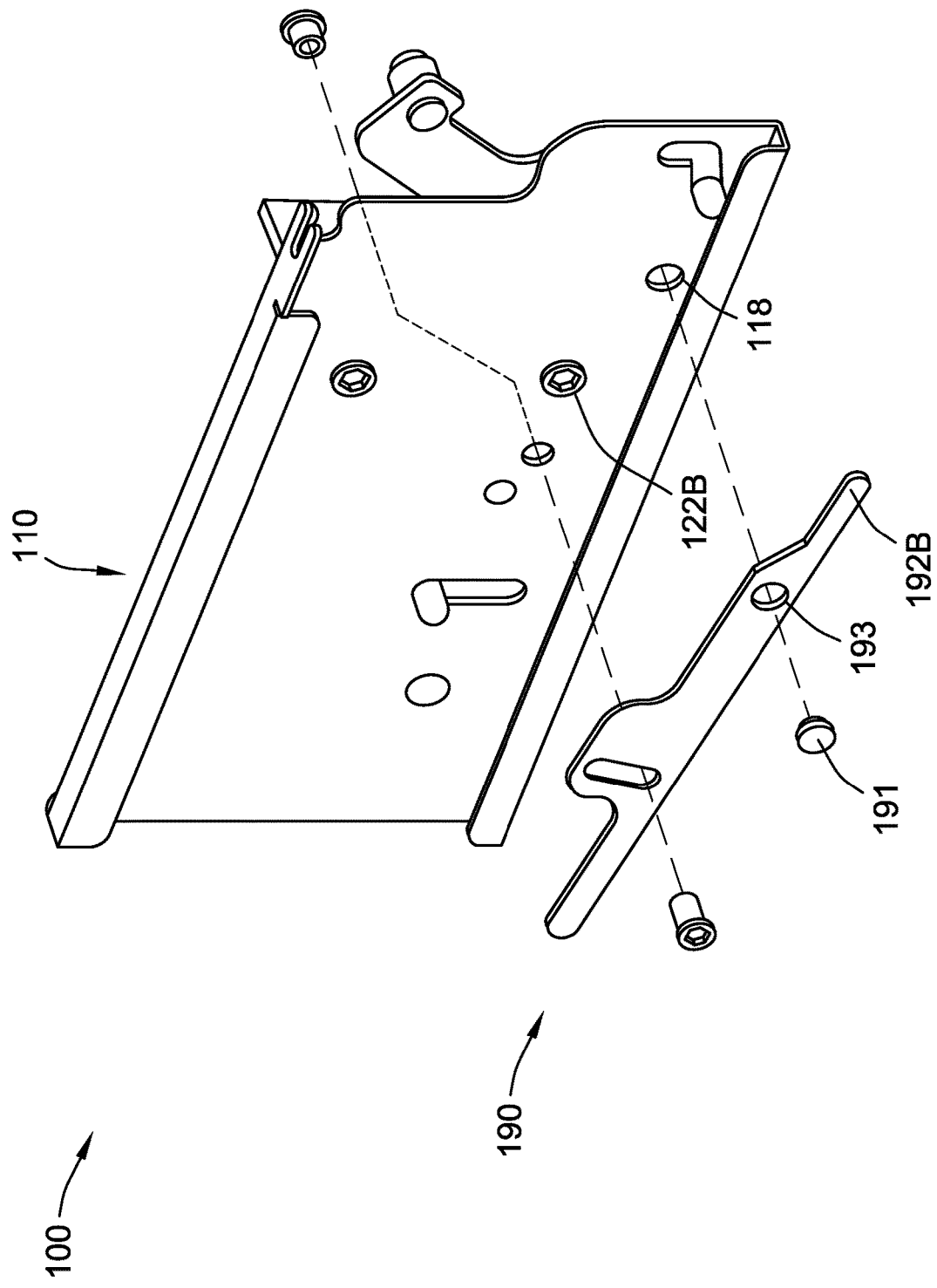

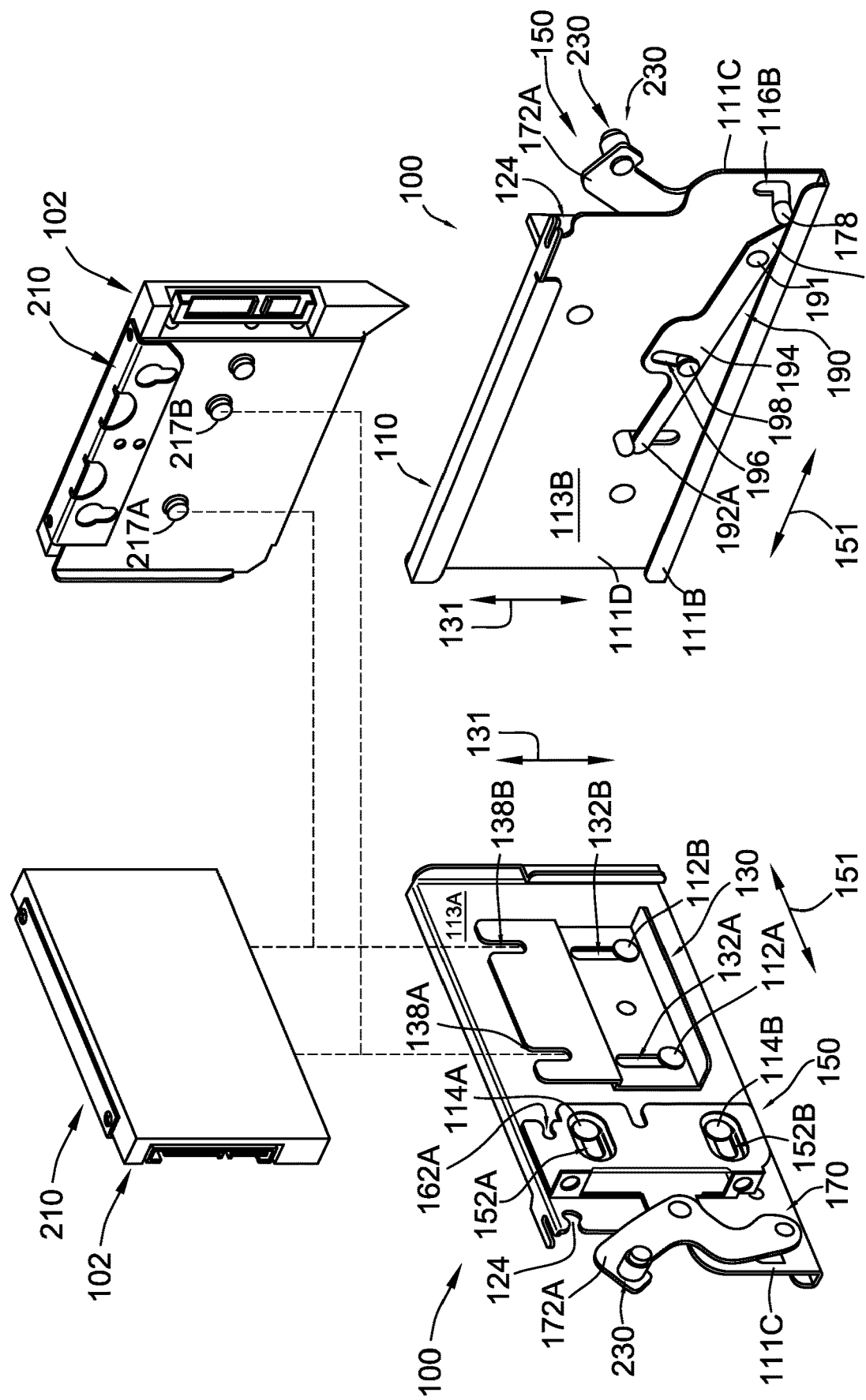

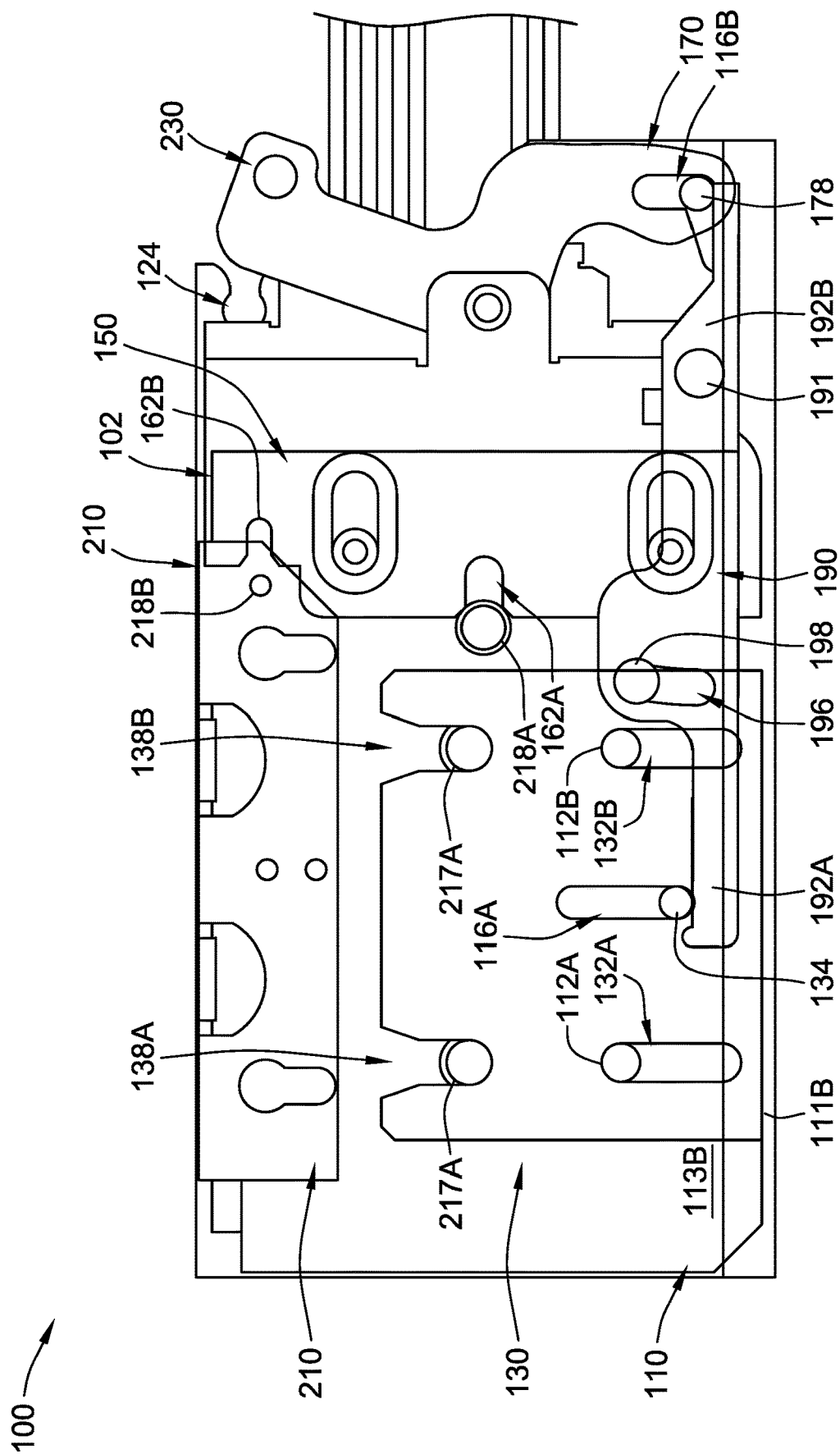

SSD CARRIER BRACKET

CROSS-REFERENCE TO RELATED APPLICATIONS

This application claims priority under 35 U.S.C. § 119 to U.S. Provisional Application No. 63/068,803, entitled "U2 SSD Carrier Tool-Less Design to Put 1U Chassis Horizontal And 2U Chassis Vertical Installation for Great Operational Usability" and filed on Aug. 21, 2020. The contents of that application are hereby incorporated by reference herein in their entirety.

TECHNICAL FIELD

The present disclosure relates generally to systems and devices for mounting an electronic device within the housing of a computing device. More particularly, aspects of this disclosure relate to a carrier device that allows an electronic device to be installed in multiple different orientations within a housing of a computing device.

BACKGROUND

Many computing devices, such as servers, include removable electronic devices (such as SSDs) that can be installed within a housing of the computing device to electrically connect to other components of the computing device. Many computing devices have the ability to electrically connect to a variety of different electronic devices that have varying sizes. Furthermore, many of these computing devices have limited internal space in which to receive these electronic devices. As a consequence, it can be difficult for a computing device to be able to physically receive a wide variety of electronic devices, particularly without the use of any additional tools. Thus, new systems and devices for installing electronic devices within the housings of computing devices are needed.

SUMMARY

In a first implementation, the present disclosure is directed toward a carrier device for holding an electronic device within a computing system. The carrier device includes a base bracket, a device bracket, a lever, and a cable holder. The device bracket is coupled to the base bracket, and is movable between an initial device bracket position and a final device bracket position. the device bracket is configured to receive the electronic device in the initial device bracket position. The lever is coupled to the base bracket and is movable between an initial lever position and a final lever position. The lever is configured to move from the initial lever position toward the final lever position in response to the device bracket moving from the initial device bracket position to the final device bracket position. The cable holder is coupled to the base bracket and to the lever. The cable holder is configured to hold one or more cables. The cable holder is further configured to move from an initial cable holder position to a final cable holder position, in response to the lever moving to the final lever position.

In some cases, when the cable holder is in the initial cable holder position, the one or more cables are not electrically connected to the electronic device, and when the cable holder is in the final cable holder position, the one or more cables are electrically connected to the electronic device. In some cases, the cable holder is slidably coupled to the base bracket, and is configured to slide relative to the base bracket between the initial cable holder position and the final cable holder position. In some cases, the lever is rotatably coupled to the base bracket, and is configured to rotate relative to the base bracket between the initial lever position and the final lever position.

In some cases, the lever is configured to move from the initial lever position to an intermediate lever position in response to the device bracket moving from the initial device bracket position to the final device bracket position. In some cases, the cable holder is configured to remain in the initial cable holder position in response to the lever moving from the initial lever position to the intermediate lever position. In some cases, the cable holder is configured to move from the initial cable holder position to the final cable holder position in response to the lever moving from the intermediate lever position to the final lever position.

In some cases, the lever includes a device lever positioned on a first side of the base bracket, and a cable lever positioned on a second side of the base bracket. The cable lever includes a protrusion extending through an aperture in the base bracket and contacting the device lever. In some cases, when the lever is in the initial lever position, the device lever is in an initial device lever position, and the cable lever is in an initial cable lever position. In some cases, when the lever is in the intermediate lever position, the device lever is in a final device lever position, and the cable lever is in an intermediate cable lever position. In some cases, when the lever is in the final lever position, the device lever is in the final device lever position, and the cable lever is in a final cable lever position.

In some cases, the device bracket includes a protrusion that extends through an aperture in the base bracket and contacts the device lever. When the device bracket moves to the final device bracket position, the protrusion of the device bracket causes the device lever to move from an initial device lever position to a final device lever position, and the device lever causes the cable lever to move from an initial cable lever position to an intermediate cable lever position. In some cases, the cable lever is configured to be manually moved from the intermediate cable lever position to a final cable lever position by a user, and when the cable lever is moved from the intermediate cable lever position to the final cable lever position, the device lever remains in the final device lever position. In some cases, the cable holder is positioned on the second side of the base bracket and is coupled to the cable lever. The cable holder is configured to move from the initial cable holder position to the final cable holder position in response to the cable holder lever being moved to the final cable holder lever position.

In some cases, the base bracket defines a slot, and the lever includes a latch. The slot of the base bracket is configured to receive the latch of the lever in response to the lever being moved to the final lever position, to thereby lock the lever in the final lever position and the cable holder in the final cable holder position. In some cases, the latch includes a protrusion. A diameter of the protrusion increases between a proximal end of the protrusion and a distal end of the protrusion. The distal end of the protrusion has a diameter greater than a width of the slot. The proximal end of the protrusion has a diameter less than or equal to the width of the slot. In some cases, the protrusion is movable between an extended position and a retracted position. The protrusion is configured to move toward the extended position when received by the slot. In some cases, the protrusion is biased toward the retracted position, such that a region of the protrusion is pressed against the base bracket at an edge of the slot, thereby locking the protrusion in the slot.

In some cases, the carrier device further comprises a stop pin. The stop pin is configured to be received within a corresponding notch defined by the cable holder when the cable holder is moved to the final cable holder position. The stop pin prevents the cable holder from being moved past the final cable holder position.

In a second implementation, the present disclosure is directed toward a computing system. The computing system comprises a computing device, an electronic device, and a carrier device. The computing device has a housing. The electronic device is configured to be positioned in the housing of the computing device in a horizontal orientation or a vertical orientation. The carrier device is configured to be positioned in the housing of the computing device to hold the electronic device. The carrier device includes a base bracket, a device bracket, a lever, and a cable holder. The device bracket is coupled to the base bracket, and is movable between an initial device bracket position and a final device bracket position. the device bracket is configured to receive the electronic device in the initial device bracket position. The lever is coupled to the base bracket and is movable between an initial lever position and a final lever position. The lever is configured to move from the initial lever position toward the final lever position in response to the device bracket moving from the initial device bracket position to the final device bracket position. The cable holder is coupled to the base bracket and to the lever. The cable holder is configured to hold one or more cables. The cable holder is further configured to move from an initial cable holder position to a final cable holder position, in response to the lever moving to the final lever position.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings.

FIG. 2B is an exploded view of the second side of the carrier device of FIG. 1A, according to aspects of the present disclosure.

FIG. 5A is a perspective view of a first side of the carrier device of FIG. 1A prior to the electronic device and the device frame of FIG. 3A being inserted into the carrier device, according to aspects of the present disclosure.

FIG. 5B is a perspective view of a second side of the carrier device of FIG. 1A prior to the electronic device and the device frame of FIG. 3A being inserted into the carrier device, according to aspects of the present disclosure.

FIG. 7 is a cut-away view of the second side of the carrier device of FIG. 1A after the electronic device and the device frame are moved to their final positions, according to aspects of the present disclosure.

Figure 1A:
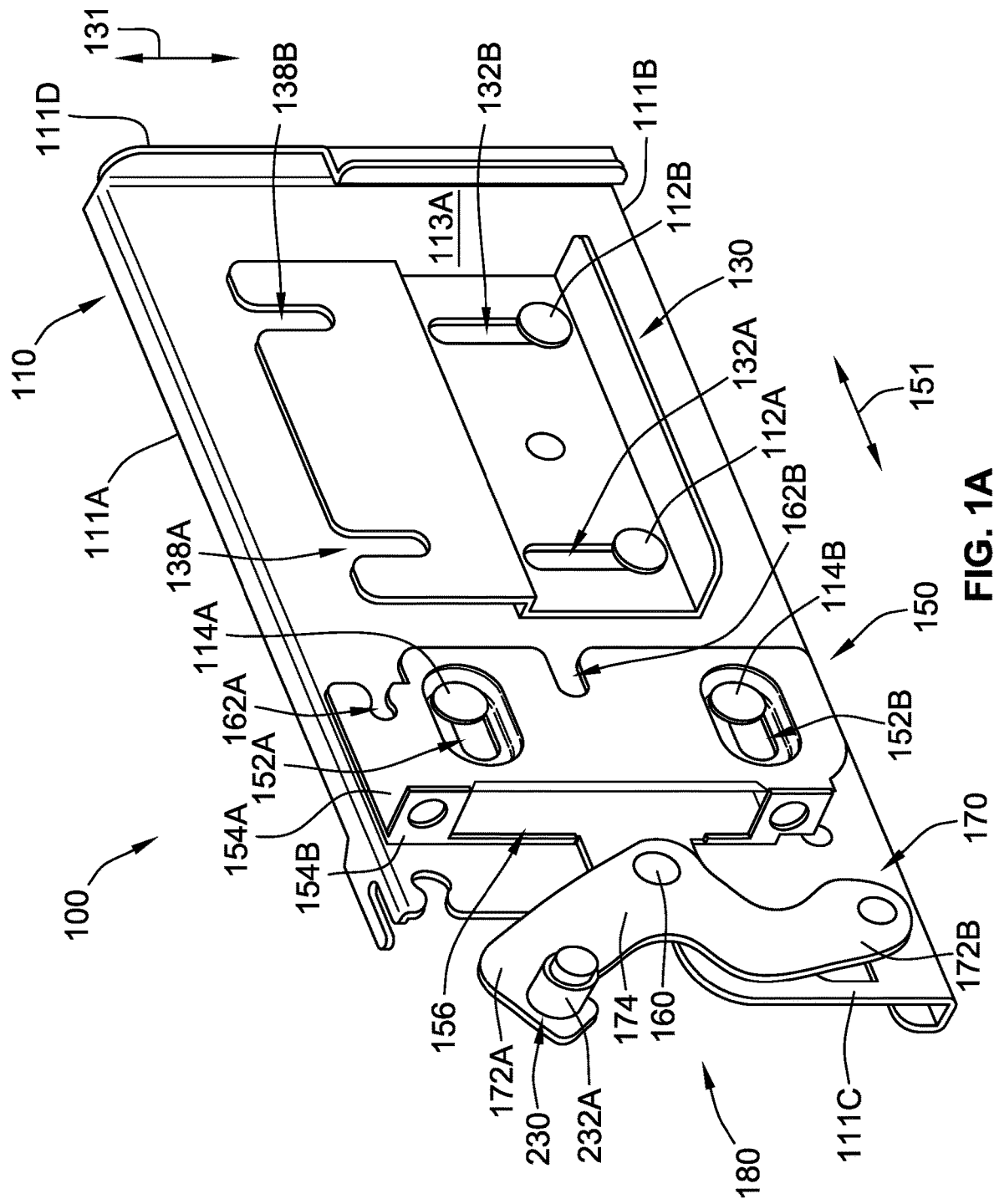
FIG. 1A is a perspective view of a first side of a carrier device for holding an electronic device within a computing system, according to aspects of the present disclosure.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of" or "within acceptable manufacturing tolerances," or any logical combination thereof, for example.

FIG. 1A is a perspective view of a carrier device 100. The carrier device 100 can hold an electronic device so that the electronic device can be electrically connected to other components of a computing system. In some implementations, the electronic device is a solid state drive (SSD), and the computing system is a server. In these implementations, the carrier device 100 and the electronic device can be positioned within a housing of the server. Other types of electronic devices can also be held by the carrier device 100, and the carrier device 100 can be used to hold electronic devices within the housings of other types of computing systems. The carrier device 100 allows for tool-less installation and uninstallation of the electronic device, and can accommodate electronic devices of various different sizes. In some implementations, the electronic device is an SSD having a thickness of 7 mm, 9 mm, 9.5 mm, or 15 mm.

Figure 1B:
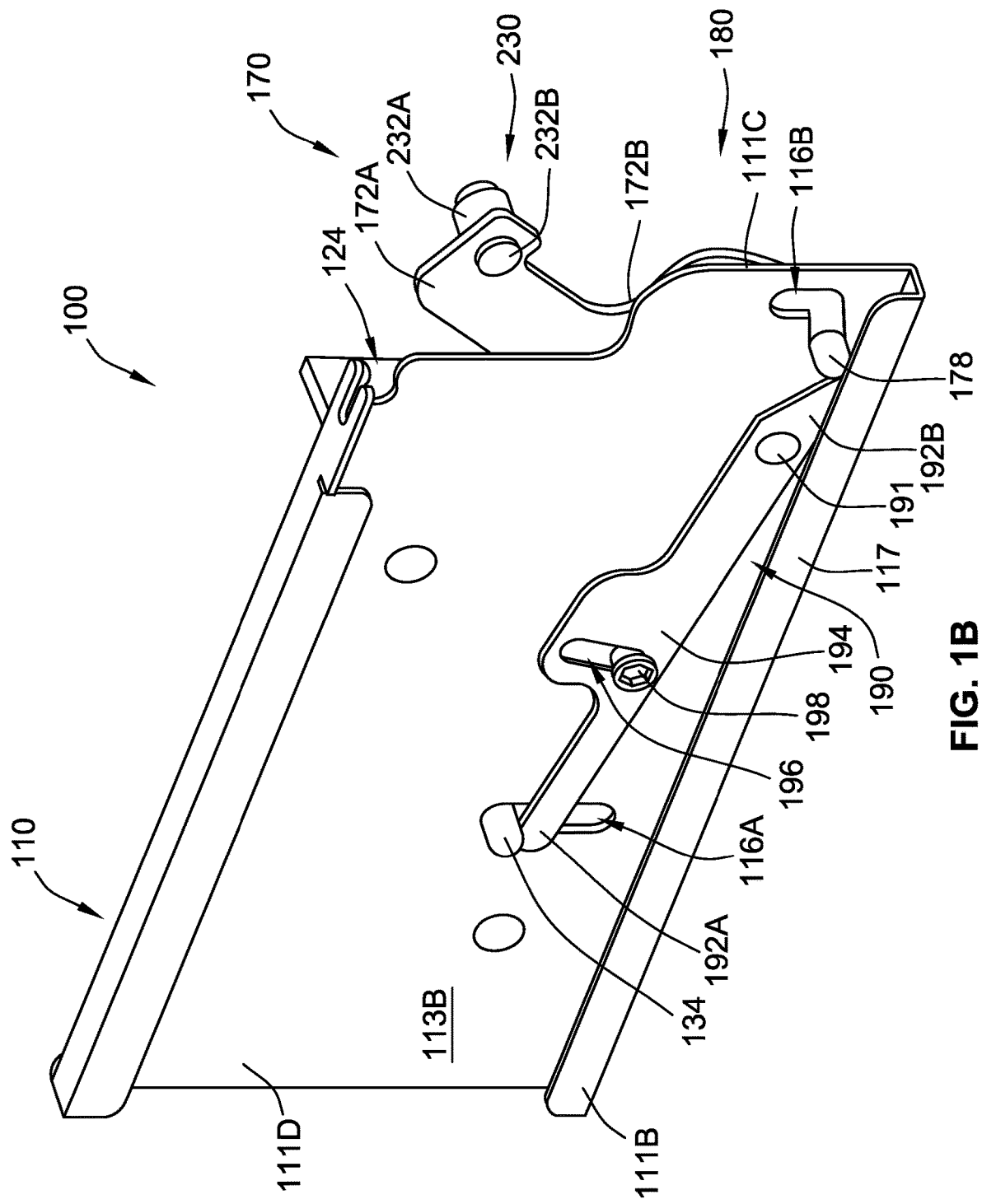
FIG. 1B is a perspective view of a second side of the carrier device of FIG. 1A, according to aspects of the present disclosure.

As shown in FIG. 1A, the carrier device 100 includes a base bracket 110, a device bracket 130, a cable holder 150, and a lever 180. The lever 180 is formed from a cable lever 170 and a device lever 190 (FIG. 1B). The base bracket 110 is formed from a body that is bounded by ends 111A, 111B, 111C, and 111D. The device bracket 130, the cable holder 150, and the cable lever 170 are all positioned adjacent to a first surface 113A of the base bracket 110, on the opposite side of the base bracket 110. The device lever 190 is positioned adjacent to an opposing second surface 113B of the base bracket 110, on one side of the base bracket 110 (FIG. 1B).

The device bracket 130 includes two slots 132A and 132B that are defined through the device bracket 130. The base bracket 110 includes two fasteners 112A and 112B that are used to couple the device bracket 130 to the base bracket 110. The fastener 112A extends through the slot 132A in the device bracket 130, while the fastener 112B extends through the slot 132B in the device bracket 130, to thereby couple the device bracket 130 to the base bracket 110. When the device bracket 130 is coupled to the base bracket 110, the slots 132A and 132B in the device bracket 130 extend along an axis 131 between the ends 111A and 111B of the base bracket 110. Thus, the device bracket 130 is movably coupled to the base bracket 110, and can slide along the axis 131 extending between the ends 111A and 111B of the base bracket 110. Finally, the device bracket 130 includes two slots 138A and 138B. The slots 138A and 138B are used to couple the electronic device to the device bracket 130, as discussed in more detail herein.

The cable holder 150 is coupled to the base bracket 110 in a similar manner as the device bracket 130. The cable holder 150 includes two slots 152A and 152B that are defined through the cable holder 150. The base bracket 110 includes two fasteners 114A and 114B that are used to couple the cable holder 150 to the base bracket 110. The fastener 114A extends through the slot 152A in the cable holder 150, while the fastener 114B extends through the slot 152B in the cable holder 150, to thereby couple the cable holder 150 to the base bracket 110. When the cable holder 150 is coupled to the base bracket 110, the slots 152A and 152B in the cable holder 150 extend along an axis 151 between the ends 111C and 111D of the base bracket 110. Thus, the cable holder 150 is movably coupled to the base bracket 110, and can slide along the axis 151 extending between the ends 111C and 111D of the base bracket 110.

The cable holder 150 is formed from a first body portion 154A and a second body portion 154B. The slots 152A and 152B are defined in the first body portion 154A. The first body portion 154A is generally coplanar with the base bracket 110. The second body portion 154B is positioned generally perpendicular to the first body portion 154A and the base bracket 110, and thus extends away from the first surface 113A of the base bracket 110. The second body portion 154A defines an opening 156 that is configured to receive one or more cables that can be connected to a cable port on the electronic device. In the illustrated implementation, opening 156 has a rectangular shape. However, in other implementations, the opening 156 can have different shapes, in order to accommodate cable ports having different shapes. The cable holder 150 further includes two slots 162A and 162B defined in an edge of the first body portion 154A nearest to the device bracket 130. The slots 162A and 162B are used to prevent movement of the cable holder 150 toward the end 111D of the base bracket 110.

The cable lever 170 has a V-shape that is formed from two legs 172A and 172B. The two legs 172A and 172B meet at a midpoint 174 that is coupled to the cable holder 150. A fastener 160 extends through both the cable holder 150 and the cable lever 170 to thereby couple the cable holder to the cable lever 170. The cable lever 170 includes a latch 230 positioned at the end of leg 172A. The latch 230 has a generally cylindrical shape. A first portion 232A of the latch 230 extends away from surface 113A of the base bracket 110 on one side of the cable lever 170.

FIG. 1B is a perspective view of the carrier device 100, showing an opposing second surface 113A of the base bracket 110. As shown in FIG. 1B, a second portion 232B of the latch 230 extends away from surface 113B of the base bracket 110, on the opposite side of the cable lever 170 from the first portion 232A of the latch 230. The corner of the base bracket 110 near the intersection of the ends 111A and 111C forms a cut-out portion 115. The leg 172A and the latch 230 are accessible from the opposite side of the base bracket 110 through cut-out portion 115. As is discussed in more detail herein, the first portion 232A of the latch 230 is configured to be received within a slot 124 that is defined along end 111A of the base bracket 110.

The lever 180, including both the cable lever 170 and the device lever 190, is visible in FIG. 1B. As shown, the device lever 190 has a generally elongated shape with two legs 192A and 192B, and a central portion 194. The device lever 190 is coupled to the second surface 113B of the base bracket 110 via a fastener 191 positioned near the end of the leg 192B. The device lever 190 is rotatably coupled to the base bracket 110 via the fastener 191. The device lever includes a slot 196 that is defined through the central portion 194. A pin 198 extends outward from the second surface 113B of the base bracket 110, and through the slot 196 defined in the central portion 194. As the device lever 190 rotates relative to the base bracket 110 on the fastener 191, the pin 198 travels within the slot 196. The ends of the slot 196 prevent the pin 198 from traveling any further, thus limiting the rotation of the device lever 190. The base bracket 110 includes a tab 117 that extends along end 111B of the base bracket 110, between ends 111C and 111D. The tab 117 forms a channel or groove into which the second leg 192B of the device lever 190 can be positioned. The tab 117 thus acts to protect the second leg 192B, and also aids in stopping movement of the second leg 192B toward the end 111B of the base bracket 110, once the second leg 192B reaches the tab 117.

As is shown in FIG. 1B, the carrier device 100 includes two protrusions 134 and 178 that contact the legs 192A and 192B of the device lever 190. The protrusions 134 and 178 travel through slots 116A and 116B, respectively, that are formed in the base bracket 110. The protrusion 134 is formed as part of the device bracket 130 (in FIG. 1A), and moves relative to the base bracket 110 when the device bracket 130 moves relative to the base bracket 110. The protrusion 134 extends from the device bracket 130, through the slot 116A that is defined in the base bracket 110, and away from the first surface 113A of the base bracket 110. The protrusion 134 is positioned above (relative to the plane of FIG. 1B) and contacts the leg 192A of the device lever 190. When the device bracket 130 moves toward end 111B of the base bracket 110, the protrusion 134 pushes against the leg 192A of the device lever 190. Because the device lever 190 is rotatably coupled to the base bracket 110 via the fastener 191, the leg 192A and the central portion 194 of the device lever 190 both move toward end 111B of the base bracket 110.

The protrusion 178 extends from the leg 172B of the cable lever 170 and contacts the leg 192B of the device lever 190. The protrusion 178 extends through the slot 116B that is defined in the base bracket near the end 111C. Movement of the protrusions 134 and 178 results in movement of the cable holder 150 (in FIG. 1A), the cable lever 170, and the device lever 190. As discussed in more detail herein, movement of the device bracket 130 toward the end 111B of the base bracket 110 causes the protrusion 134 to move the first leg 192A of the device lever 190 toward the end 111B of the base bracket 110. This movement of the first leg 192A causes the second leg 192B and the pin 198 to move toward the end 111A and the end 111C of the base bracket 110. The movement of the pin 198 causes the cable holder 150 to rotate about its midpoint 174, which in turns causes the cable holder 150 to move towards the end 111D of the base bracket 110.

Figure 2A:
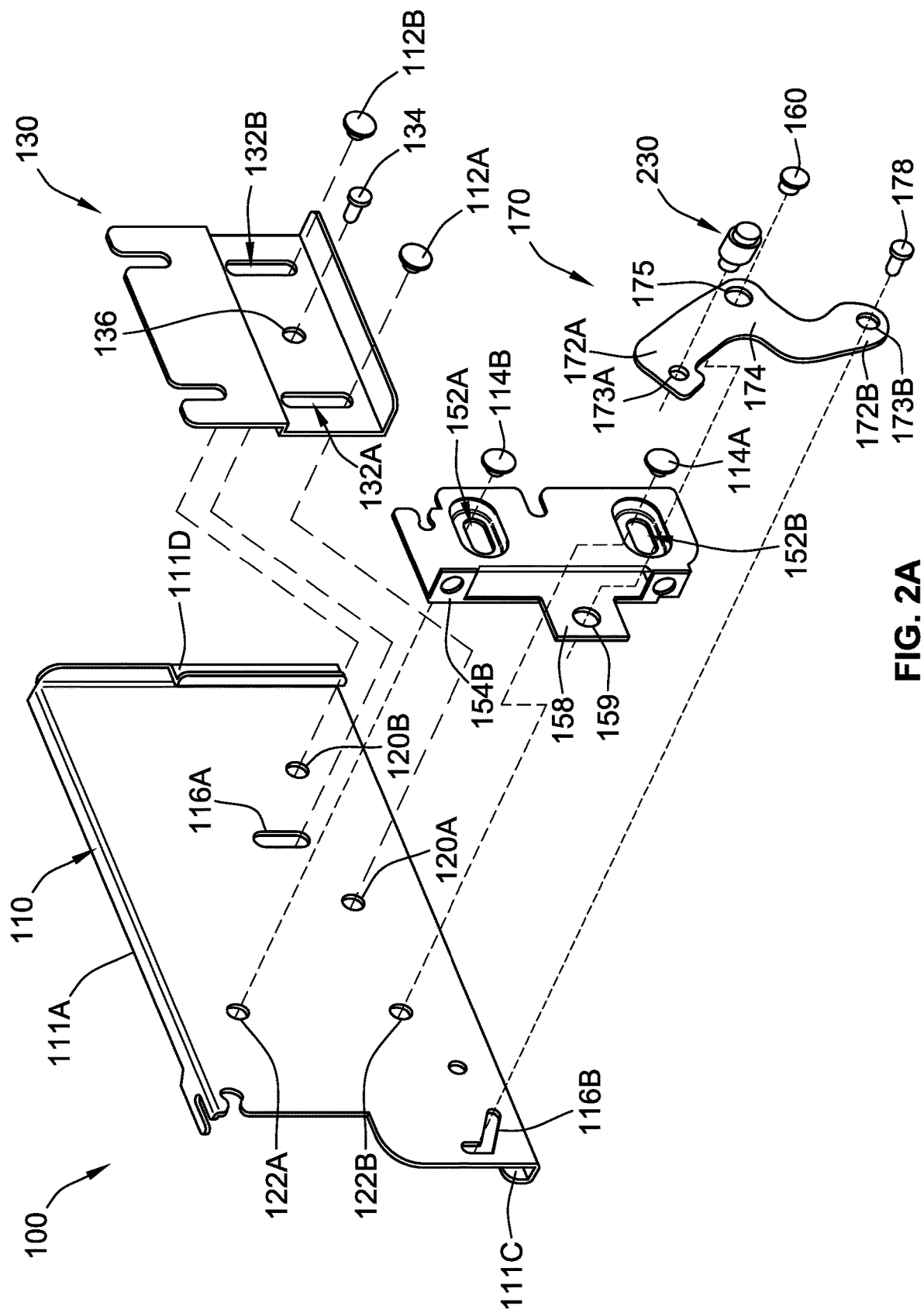
FIG. 2A is an exploded view of the first side of the carrier device of FIG. 1A, according to aspects of the present disclosure.

FIG. 2A shows an exploded view of the carrier device 100 from FIG. 1A. Like elements from FIG. 1A are labeled with identical reference numbers in FIG. 2A. As shown in FIG. 2A, the fasteners 112A and 112B of the base bracket 110 can be inserted through the slots 132A and 132B of the device bracket 130, and into corresponding apertures 120A and 120B defined in the base bracket 110. Similarly, the fasteners 114A and 114B of the base bracket 110 can be inserted through the slots 152A and 152B of the cable holder 150 (in FIG. 1A), and into corresponding apertures 122A and 122B (FIG. 1B) defined in the base bracket 110. The protrusion 134 can also be formed separately from the device bracket 130, and can be inserted through an aperture 136 in the device bracket and through the slot 116A in the base bracket 110. In other implementations, the protrusion 134 can be integrally formed with the device bracket 130.

The cable lever 170 includes an aperture 173A defined at the end of the leg 172A and an aperture 173B defined at the end of the leg 172B. The latch 230 can be formed separately from the cable lever 170, and inserted through the aperture 173A. The protrusion 178 is similar to the protrusion 134, and can be formed separately from the cable lever 170. The protrusion 178 can be inserted through the aperture 173B in the second leg 172B, and through the slot 116B in the base bracket 110. However, in other implementations, the protrusion 178 can be integrally formed with the cable lever 170. As can be seen in FIG. 2A, the slot 116B has a generally curved shape with two portions. One portion of the slot 116B extends in a direction generally between ends 111A and 111B of the base bracket 110, while the other portion extends in a direction generally between ends 111C and 111D of the base bracket 110.

The cable holder 150 and the cable lever 170 are coupled together via the fastener 160. The cable lever 170 includes an aperture 175 defined at the midpoint 174. The cable holder 150 includes a tab 158 extending away from the second body portion 154B of the cable holder 150. An aperture 159 is defined in the tab 158. The fastener 160 can be inserted through both the aperture 159, as well as the aperture 175 defined in the midpoint 174 of the cable lever. The cable holder 150 and the cable lever 170 are thus rotatably coupled and are able to rotate relative to each other.

FIG. 2B shows an exploded view of the carrier device 100 from FIG. 1B. Like elements from FIG. 1B are labeled with identical reference numbers in FIG. 2B. FIG. 2B shows the device lever 190 spaced apart from the base bracket 110. The fastener 191 of the device lever 190 is configured to be inserted through an aperture 193 that is defined in the leg 192B of the device lever 190. The fastener 191 is also configured to be inserted through a corresponding aperture 118 in the base bracket 110, to thereby rotatably couple the device lever 190 to the base bracket 110. The apertures 122A and 122B in the base bracket 110 through which the fasteners 114A and 114B (both in FIG. 2A) of the base bracket 110 are inserted are also shown in FIG. 2B.

Figure 3A:
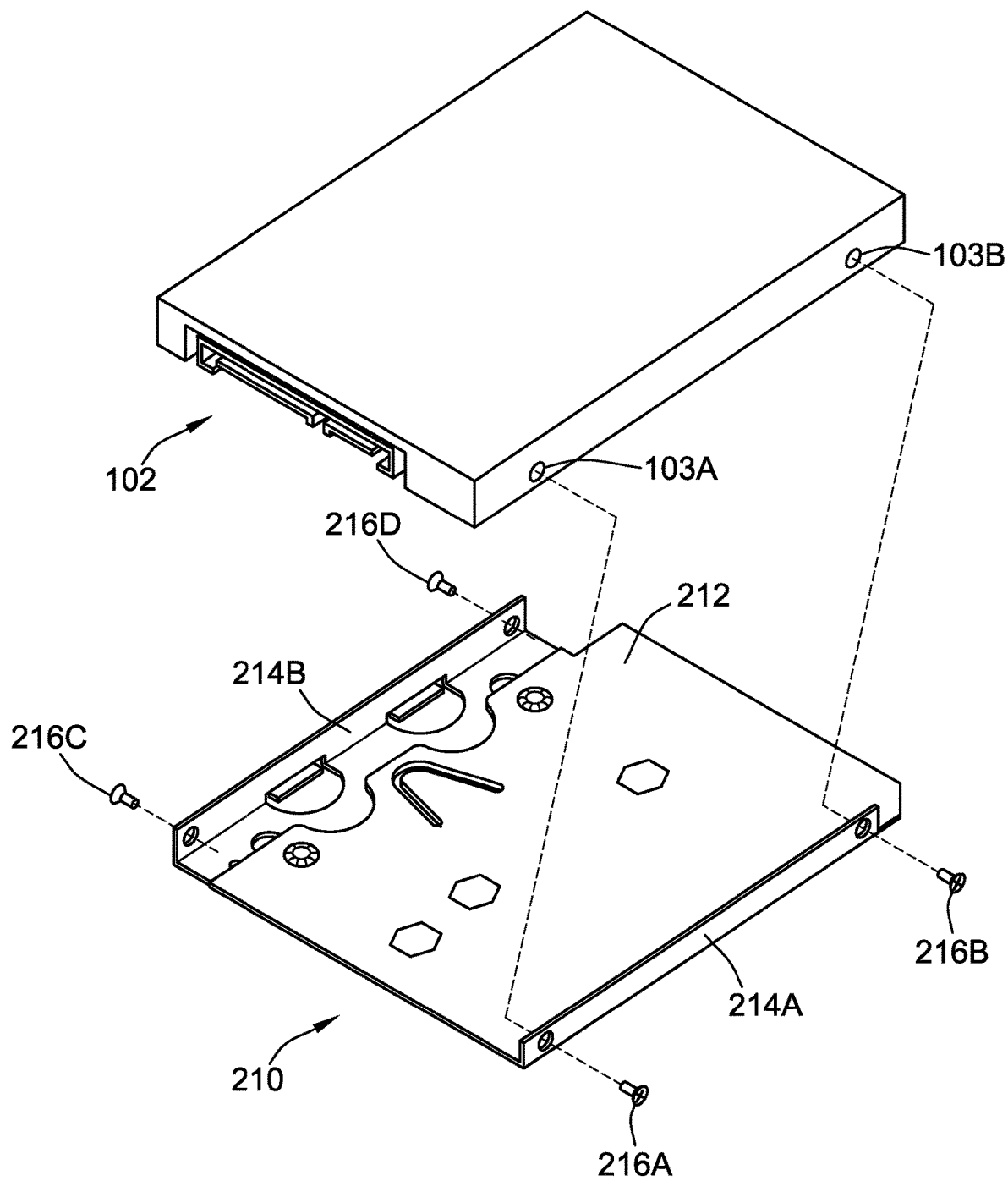
FIG. 3A is a perspective view of an electronic device and a device frame for use with the carrier device of FIG. 1A, according to aspects of the present disclosure.

FIG. 3A illustrates a first step of attaching an electronic device 102 to the carrier device 100. In the illustrated implementation, the electronic device 102 is a solid-state drive (SSD). However, other types of electronic devices 102 can also be used with the carrier device 100. FIG. 3A shows a device frame 210 that can be attached to the electronic device 102, prior to inserting the electronic device 102 into the carrier device 100. The electronic device 102 includes a cable port 104 configured to receive one or more cables. The device frame 210 includes a base 212 and two raised sidewalls 214A and 214B. The width of the base 212 (e.g., the distance between the sidewalls 214A and 214B) generally matches the width of the electronic device 102, so that the electronic device 102 can fit between the sidewalls 214A and 214B. The device frame 210 also has four pins 216A, 216B, 216C, and 216D. The pins 216A and 216B extend from the sidewall 214A toward the sidewall 214B. The pins 216C and 216D extend from the sidewall 214B toward the sidewall 214A. When the electronic device 102 is inserted into the device frame 210, the pins 216A and 216B are received in depressions 103A and 103B defined on one side of the electronic device 102. The pins 216C and 216D are received in corresponding depressions defined on the other side of the electronic device 102.

Figure 3B:
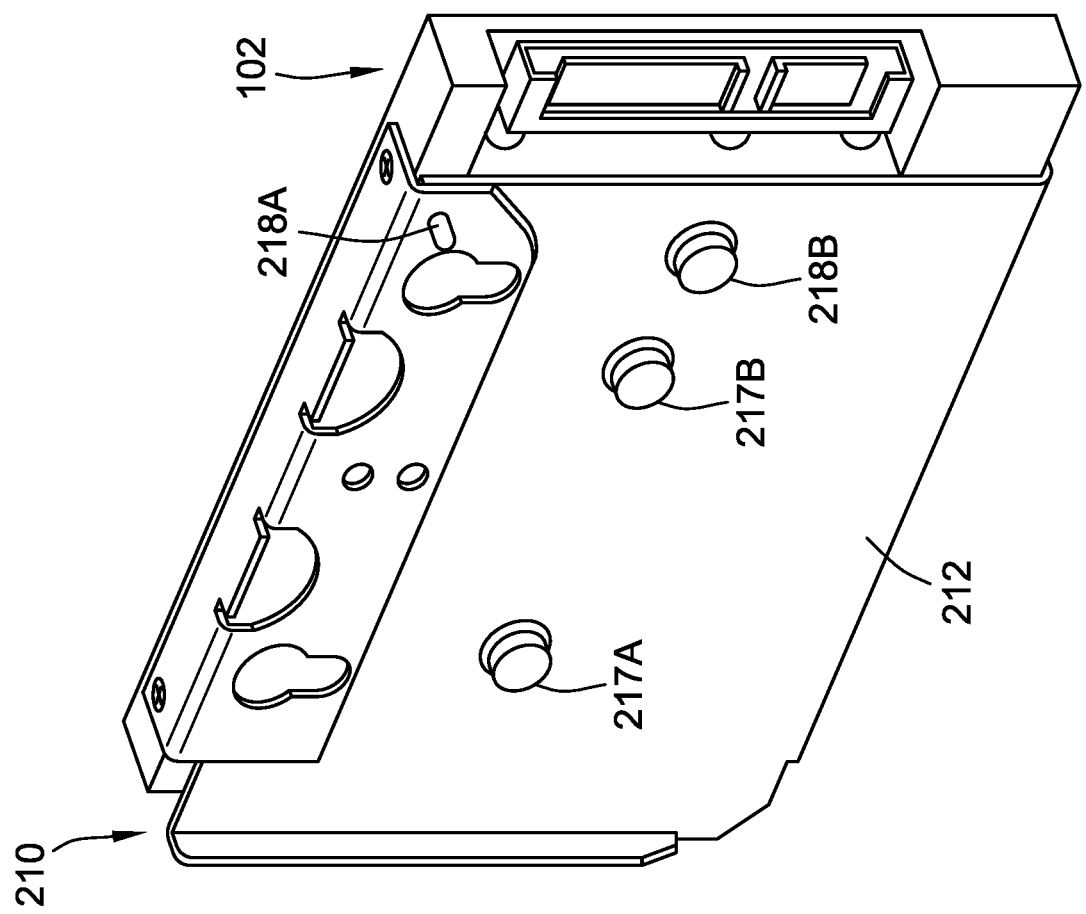
FIG. 3B is a perspective view of the electronic device and the device frame of FIG. 3A coupled together, according to aspects of the present disclosure.

FIG. 3B shows the underside of the base 212 of the device frame 210, once the device frame 210 has been attached to the electronic device 102. As shown, the cable port 104 is not covered or obstructed by the device frame 210. The base 212 includes two protrusions 217A and 217B. When the electronic device 102 and the device frame 210 are inserted into the carrier device 100, the protrusions 217A and 217B are used to secure the device frame 210 to the device bracket 130. The protrusion 217A is configured to slide into the slot 138A of the device bracket 130 (FIG. 1A), and the protrusion 217B is configured to slide into the slot 138B of the device bracket 130 (FIG. 1A).

The device frame 210 also includes two stop pins 218A and 218B extending from the underside of the base 212. When the device frame 210 and the electronic device 102 are inserted into the carrier device 100, the stop pins 218A and 218B are positioned between the base bracket 110 and the base 212 of the device frame 210. The stop pins 218A and 218B are sized to be received by the slots 162A and 162B (FIG. 1A) of the cable holder 150, when the cable holder 150 is moved toward the device frame 210 and the electronic device 102. The stop pins 218A and 218B thus aid in preventing further movement of the cable holder 150, as discussed in more detail herein.

Figure 4A:
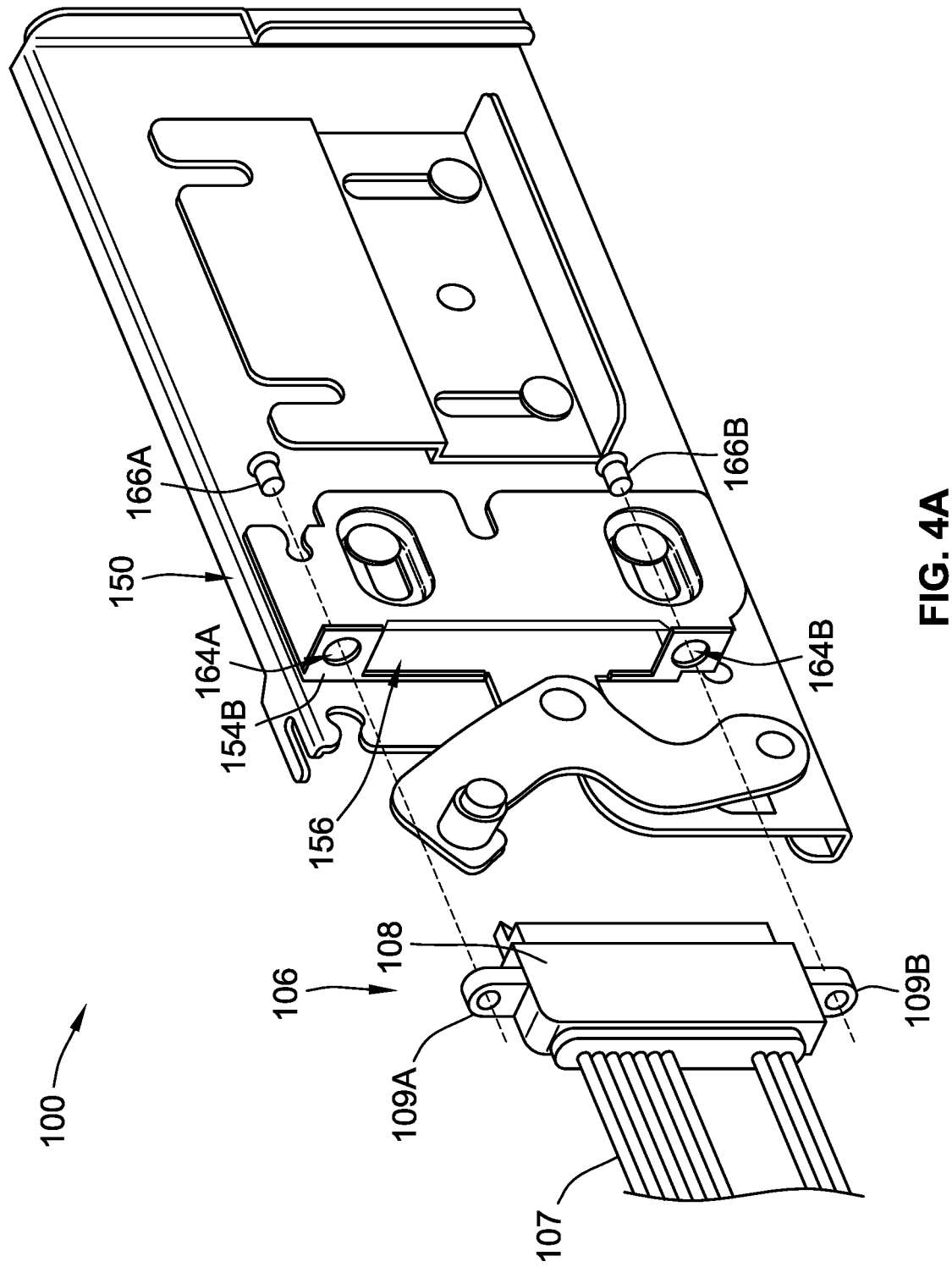
FIG. 4A is a perspective view of the first side of the carrier device of FIG. 1A, prior to a cable bundle being coupled to the carrier device, according to aspects of the present disclosure.

FIG. 4A shows the carrier device 100 prior to a cable bundle 106 being coupled to the cable holder 150. The cable bundle 106 can be used to electrically connect the electronic device 102 (in FIGS. 3A and 3B) to other components within a computing system. The cable bundle 106 includes one or more cables 107 coupled to a connector 108. The connector 108 is generally aligned with the opening 156 defined in the second body portion 154B of the cable holder 150. The connector 108 defines two apertures 109A and 109B on either end of the connector 108. The aperture 109A of the cable bundle 106 is aligned with a corresponding aperture 164A defined in the second body portion 154B of the cable holder 150. Similarly, the aperture 109B of the cable bundle 106 is aligned with a corresponding aperture 164B defined in the second body portion 154B.

Fasteners 166A and 166B can be used to couple the cable bundle 106 to the cable holder 150. In the illustrated implementation, the fasteners 166A and 166B are screws. In other implementations, other types of fasteners can be used. The fastener 166A is configured to screw into both the aperture 109A of the connector 108, and the aperture 164A of the cable holder 150. The fastener 166B is configured to screw into both the aperture 109B of the connector 108, and the aperture 164B of the cable holder 150.

Figure 4B:
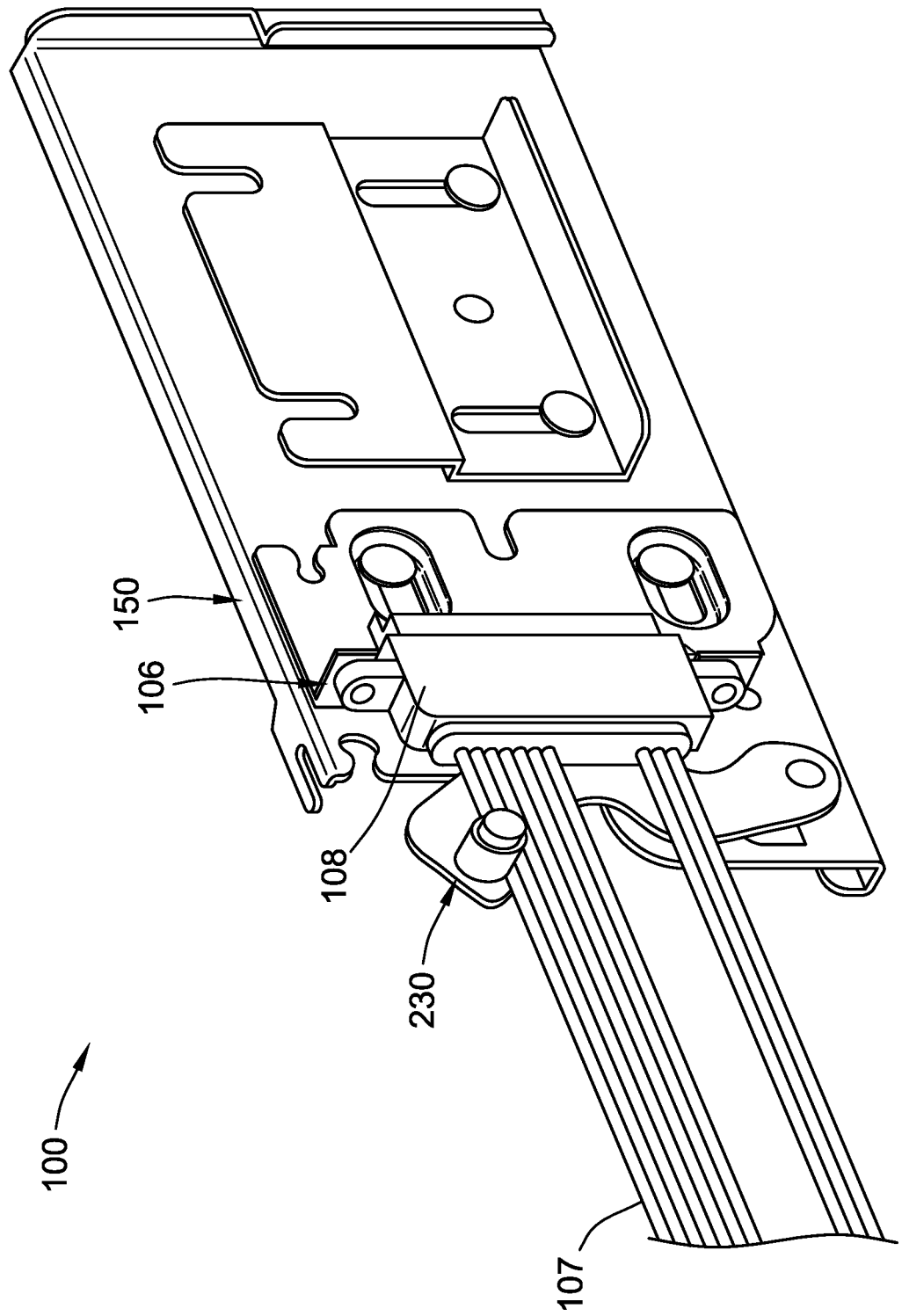
FIG. 4B is a perspective view of the first side of a carrier device of FIG. 1A after the cable bundle has been coupled to the carrier device, according to aspects of the present disclosure.

FIG. 4B shows the carrier device 100, after the cable bundle 106 has been coupled to the cable holder 150. The connector 108 extends through the opening 156 (FIG. 4A) in the cable holder 150, where the connector 108 is accessible on the other side of the cable holder 150. As shown in FIG. 4B, the connector 108 of the cable bundle 106 is positioned between the latch 230 and the cable holder 150. The latch 230 generally abuts the one or more cables 107 of the cable bundle 106.

Once the electronic device 102 has been coupled to the device frame 210 (as shown in FIGS. 3A and 3B), and the cable bundle 106 has been coupled to the cable holder 150 (as shown in FIGS. 4A and 4B), the electronic device 102 and the device frame 210 can be inserted into the carrier device 100.

FIGS. 5A and 5B show perspective views of the first surface 113A (FIG. 5A) of the base bracket 110 and the second surface 113B (FIG. 5B) of the base bracket 110, before the electronic device 102 and the device frame 210 are inserted into the carrier device 100. The device frame 210 is positioned relative to the base bracket 110 such that the protrusion 217A of the device frame 210 is aligned with the slot 138A of the device bracket 130, and such that the protrusion 217B of the device frame 210 is aligned with the slot 138B of the device bracket 130.

Prior to the electronic device 102 and the device frame 210 being inserted into the carrier device 100, the device bracket 130, the cable holder 150, the cable lever 170, and the device lever 190 are all in their respective initial positions. The device bracket 130 is able to move relative to the base bracket 110 along the axis 131 (which extends between the ends 111A and 111B of the base bracket 110). Before the electronic device 102 and the device frame 210 are inserted into the carrier device 100, the device bracket 130 is moved toward the end 111A of the base bracket 110. The fasteners 112A and 112B are positioned at the ends of the slots 132A and 132B that are closest to the end 111B. Thus, the device bracket 130 is positioned generally as far upward (relative to the plane of FIGS. 5A and 5B) as possible when the device bracket 130 is in the initial device bracket position. A bottom edge 133 of the device bracket 130 is spaced apart from the end 111B of the base bracket 110, when the device bracket 130 is in the initial device bracket position.

The cable holder 150 is able to move relative to the base bracket 110 along the axis 151 connecting ends 111C and 111D of the base bracket 110. Before the electronic device 102 and the device frame 210 are inserted into the carrier device 100, the cable holder 150 is moved toward the end 111C of the base bracket 110. The fasteners 114A and 114B are positioned at the ends of the slots 152A and 152B of the cable holder 150 that are closest to the end 111D of the base bracket 110. Thus, the cable holder 150 is positioned generally as far leftward (relative to the plane of FIG. 5A) as possible when the cable holder 150 is in the cable holder initial position.

When the cable lever 170 is in the initial cable lever position, the leg 172A and the latch 230 are generally rotated as far away from the base bracket 110 as possible. In this position, the protrusion 178 of the cable lever 170 is positioned at the end of the slot 116B that is closest to ends 111B and 111D of the base bracket 110. The latch 230 is also generally spaced part from the slot 124 defined in the base bracket 110.

The device lever 190 is able to rotate relative to the base bracket 110 about the fastener 191. When the device lever 190 is in the initial device lever position, the leg 192A is rotated towards the end 111A of the base bracket 110, while the leg 192B is rotated toward the end 111B of the base bracket 110. The central portion 194 of the device lever 190 is also generally rotated toward the end 111A of the base bracket 110, such that the pin 198 is positioned at the end of the slot 196 that is closer to end 111B of the base bracket 110. Thus, when the lever of the carrier device 100 is in an initial lever position, the cable lever 170 is in the initial cable lever position (FIG. 5A) and the device lever 190 is in the initial device lever position (FIG. 5B).

Figure 6A:
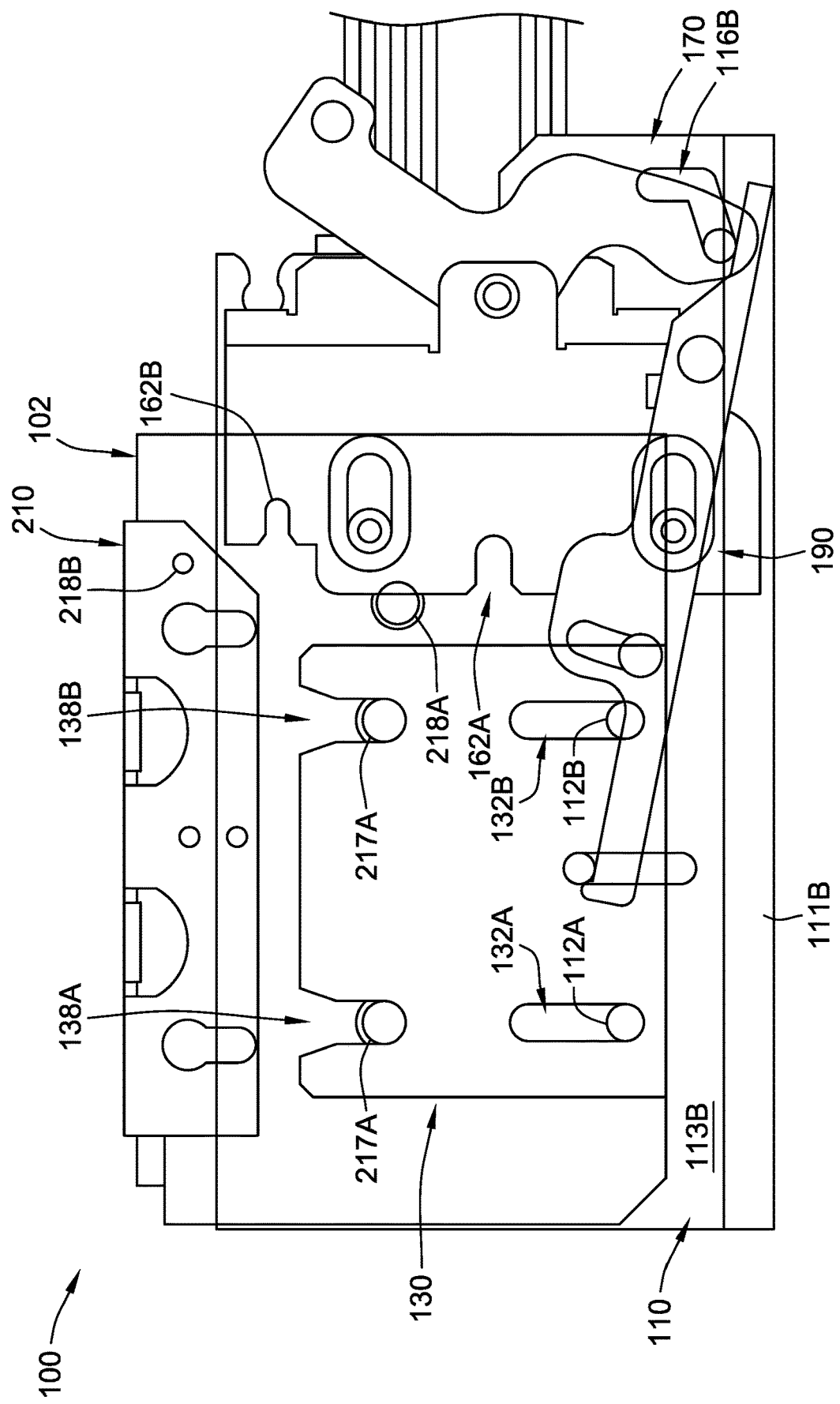
FIG. 6A is a cut-away view of the second side of the carrier device of FIG. 1A as the electronic device and the device frame of FIG. 3A are initially inserted into the carrier device, according to aspects of the present disclosure.

FIG. 6A is a cut-away view of the second surface 113B of the base bracket 110 of the carrier device 100. FIG. 6A shows the carrier device 100 as the electronic device 102 and the device frame 210 are initially inserted into the carrier device 100. The slot 138A of the device bracket 130 receives the protrusion 217A of the device frame 210, and the slot 138B of the device bracket 130 receives the protrusion 217B of the device frame 210. In FIG. 6A, the device bracket 130 is still in the initial device bracket position, as the fasteners 112A and 112B are positioned at the ends of the slots 132A and 132B in the device bracket 130 that are nearest to the end 111B of the base bracket 110. When the device bracket 130 is in the initial device bracket position, the stop pin 218A is not aligned with the slot 162A in the cable holder 150 (in FIG. 5A), and the stop pin 218B is not aligned with the slot 162B in the cable holder 150. Thus, the device bracket 130 receives the electronic device 102 and the device frame 210 when the device bracket 130 is in the initial device bracket position. The cable lever 170 and the device lever 190 are also still in the initial device lever position.

Figure 6B:
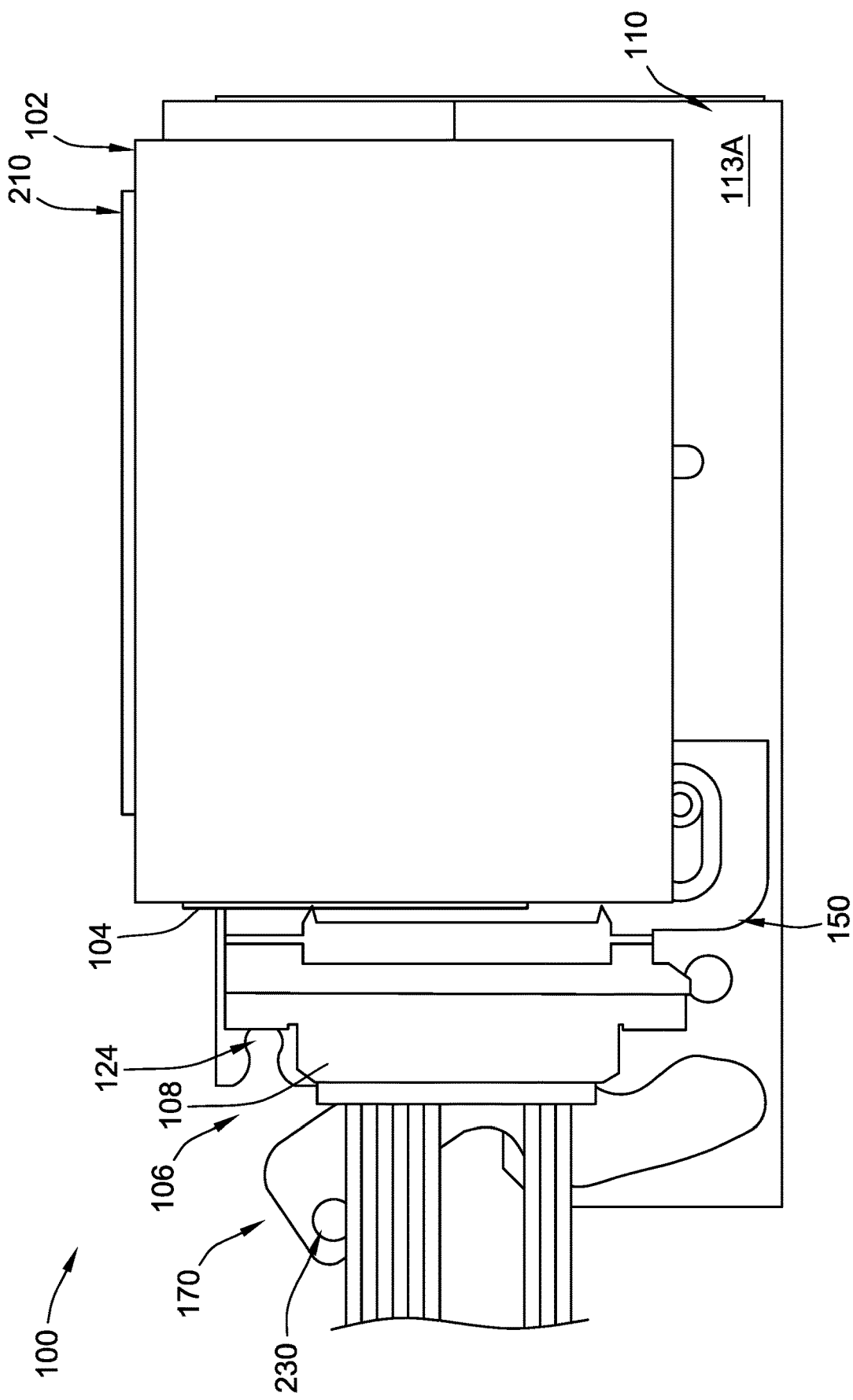
FIG. 6B is a cut-away view of the first side of the carrier device of FIG. 6A, according to aspects of the present disclosure.

FIG. 6B is an opposing side view of the first surface 113A of the base bracket 110 of the carrier device 100. FIG. 6B shows the carrier device 100 as the electronic device 102 and the device frame 210 are initially inserted into the carrier device 100. As shown, the cable port 104 of the electronic device 102 is positioned just slightly above (relative to the plane of FIG. 6B) the connector 108 of the cable bundle 106, which is held by the cable holder 150. The cable holder 150 is in the initial cable holder position, and the cable lever 170 is in the initial cable lever position. The connector 108 of the cable bundle 106 is spaced apart from the cable port 104 of the electronic device 102. Similarly, the latch 230 of the cable lever 170 is spaced apart from the slot 124 of the device bracket.

Thus, FIGS. 6A and 6B show the carrier device 100 when the device bracket 130 has received the electronic device 102, but prior to the device bracket 130 moving out of the initial device bracket position. The lever of the carrier device 100 (formed from the cable lever 170 and the device lever 190) is in the initial lever position. When the lever is in the initial lever position, the cable lever 170 is in the initial cable lever position and the device lever 190 is in the initial device lever position. Additionally, when the lever is in the initial lever position, the cable holder 150 is in the initial cable holder position. When the cable holder 150 is in the initial cable holder position, the one or more cables 107 of the cable bundle 106 are not electrically connected to the electronic device 102.

FIG. 7 is a cut-away view of the second surface 113B of the base bracket 110 of the carrier device 100. FIG. 7 shows the carrier device 100 after the device bracket 130 has been moved to a final device bracket position. The protrusions 217A and 217B of the device frame 210 are still seated within the slots 138A and 138B of the device bracket 130. The device bracket 130 has been moved toward end 111B of the base bracket 110. The fasteners 112A and 112B have moved to the opposite ends of the slots 132A and 132B, that are nearest to the end 111B of the base bracket 110. In the final device bracket position, the stop pin 218A is aligned with the slot 162A, and the stop pin 218B is aligned with the slot 162B. However, the stop pins 218A and 218B are still positioned outside of the slots 162A and 162B.

In response to the device bracket 130 moving to the final device bracket position, the lever 180 of the carrier device 100 (formed from the cable lever 170 and the device lever 190) moves to an intermediate lever position. When the lever is in the intermediate lever position, the device lever 190 is in a final device lever position, as illustrated in FIG. 7. As the device bracket 130 moves, the protrusion 134 presses against the end of the first leg 192A of the device lever 190. The device lever 190 in turn pivots about the fastener 191, such that the first leg 192A and the central portion 194 move toward the end 111B of the base bracket 110, and the second leg 192B moves toward the end 111A of the base bracket 110.

The device lever 190 thus pivots until it is positioned in the final device lever position. In the final device lever position, the protrusion 134 is positioned at an end of the slot 116A in the base bracket 110 that is closer to the end 111B of the base bracket 110. Similarly, the pin 198 of the device lever 190 moves within the slot 196, until the pin 198 is positioned at the end of the slot 196 that is closer to the end 111A of the base bracket 110.

The second leg 192B presses against the protrusion 178 of the cable lever 170 as the second leg 192B moves toward the end 111A of the base bracket 110. The protrusion 178 is moved within the slot 116B (in FIG. 6A) of the base bracket 110, and the cable lever 170 rotates counter-clockwise relative to the plane of FIG. 7. The cable lever 170 rotates until the device bracket 130 reaches the final device bracket position. Thus, when the lever is in the intermediate lever position, the cable lever 170 is in an intermediate cable lever position. When the cable lever 170 rotates to the intermediate cable lever position, the latch 230 moves toward the slot 124 of the base bracket 110. Because the cable lever 170 is rotatably coupled to the cable holder 150, the cable lever 170 is able to rotate to the intermediate cable lever position without causing the cable holder 150 to move laterally toward the electronic device 102.

Thus, FIG. 7 shows the carrier device 100 when the device bracket 130 has been moved from the initial device bracket position to the final device bracket position. As the device bracket 130 moves toward the final device bracket position, the lever of the carrier device 100 (formed from the cable lever 170 and the device lever 190) moves from the initial lever position to the intermediate lever position. When the lever moves to the intermediate lever position, the cable lever 170 moves to the intermediate cable lever position, the device lever 190 moves to the final device lever position, and the cable holder 150 remains in the initial cable holder position. However, in some implementations, the cable holder 150 may move from the initial cable holder position toward a final cable holder position, in response to the lever moving from the initial lever position to the intermediate lever position.

Figure 8A:
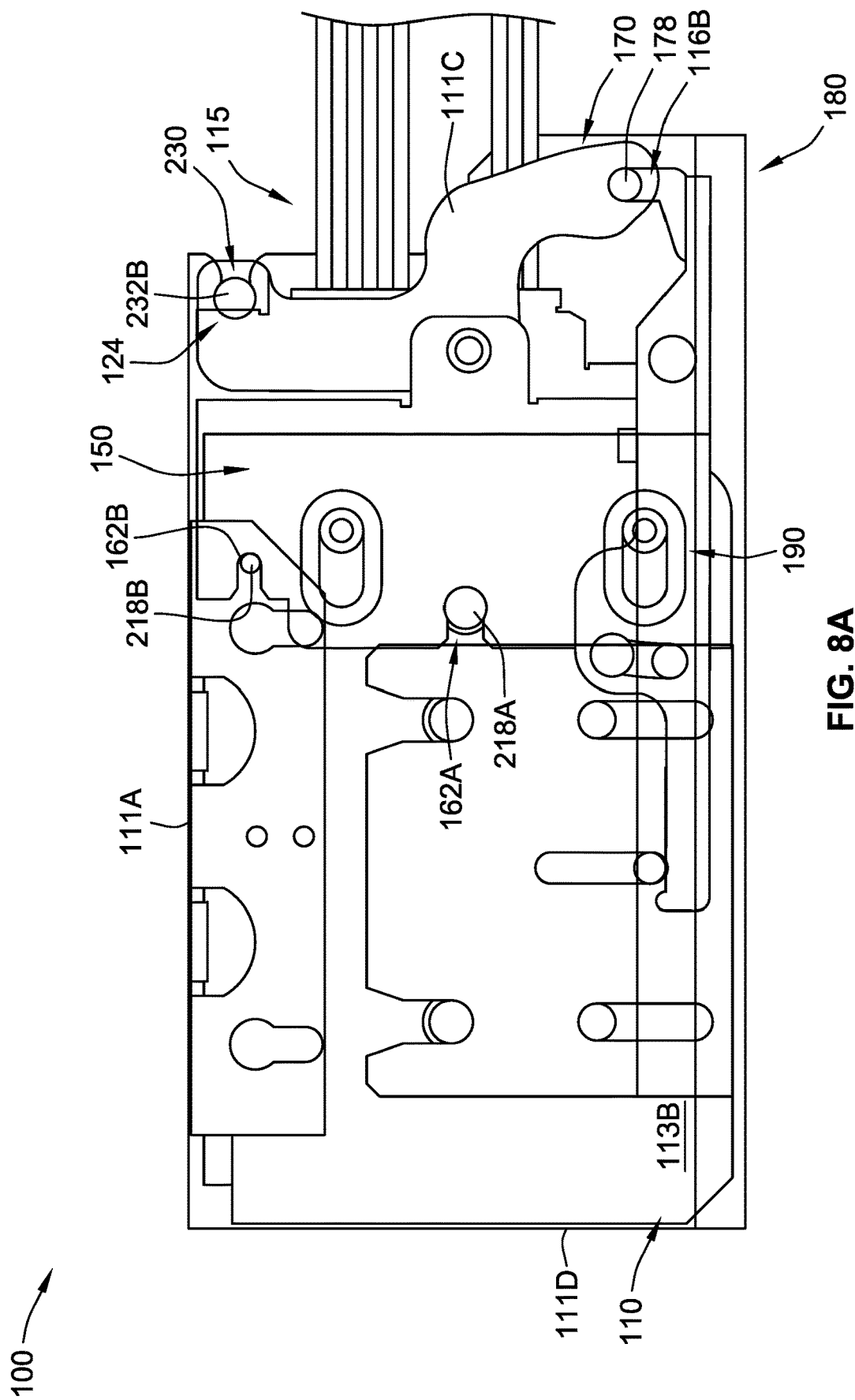
FIG. 8A is a cut-away view of the second side of the carrier device of FIG. 1A after a lever of the carrier device has been moved to its final position, according to aspects of the present disclosure.

FIG. 8A is a cut-away view of the second surface 113B of the base bracket 110 of the carrier device 100. FIG. 8A shows the carrier device 100 after the lever 180 of the carrier device 100 is moved to a final lever position. When the lever is in the final lever position, the cable lever 170 is rotated to a final cable lever position, and the device lever 190 remains in the final device lever position. In some implementations, the cable lever 170 can be manually rotated to the final cable lever position by a user. When the cable lever 170 is moved to the final cable lever position, the protrusion 178 moves within the second portion of the slot 116B of the base bracket 110. The protrusion 178 moves away from the end 111B of the base bracket 110, toward the end 111A and the cut-out portion 115.

As can be seen in FIG. 8A, the protrusion 178 moves generally in a straight line away from the end 111B and toward the end 111A. Because the protrusion 178 is not able to move laterally within the slot 116B (e.g., between end 111C and end 111D), rotation of the cable lever 170 to the final cable lever position causes the cable holder 150 to move laterally toward the electronic device 102. Thus, movement of the lever from the intermediate lever position to the final lever position (and thus movement of the cable lever 170 from the intermediate cable lever position to the final cable lever position) causes the cable holder 150 to move from the initial cable holder position to the final cable holder position.

The movement of the cable holder 150 to the final cable holder position is limited at least by the stop pins 218A and 218B of the device frame 210. As shown in FIG. 8A, when the cable holder 150 moves to the final cable holder position, the stop pin 218A is received in the slot 162A of the cable holder 150, and the stop pin 218B is received in the slot 162B of the cable holder 150. Once the stop pins 218A and 218B reach the end of their respective slots 162A and 162B, the cable holder 150 and the cable lever 170 are prevented from moving any further. The protrusion 178 can also limit the movement of the cable holder 150. Once the protrusion 178 reaches the end of the slot 116B closest to the cut-out portion 115 of the base bracket 110, the cable holder 150 and the cable lever 170 are prevented from moving any further.

The latch 230 of the cable lever 170 also aids in locking the cable lever 170 in the final cable lever position, and the cable holder 150 in the final cable holder position. When the cable lever 170 moves to the final cable lever position, the latch 230 rotates toward the slot 124 defined in the base bracket 110, and is received within the slot 124. As shown in FIG. 8A, the second portion 232B of the latch 230 extends away from the slot 124, on the same side of the base bracket 110 as the device lever 190.

Once the latch 230 is received within the slot 124, the latch 230 is biased to remain within the slot 124. In some implementations, the latch 230 can include an internal spring that can cause at least a portion of the latch 230 to press against at least a portion of the base bracket 110 near the slot 124, to thereby bias the latch 230 to remain within the slot 124. As such, the latch 230 prevents the cable holder 150 from inadvertently moving from the final cable holder position to the initial cable holder position. Generally, a certain amount of force is required to remove the latch 230 from the slot 124, so that a user can manually move the cable holder 150 from the final cable holder position to the initial cable holder position.

Figure 8B:
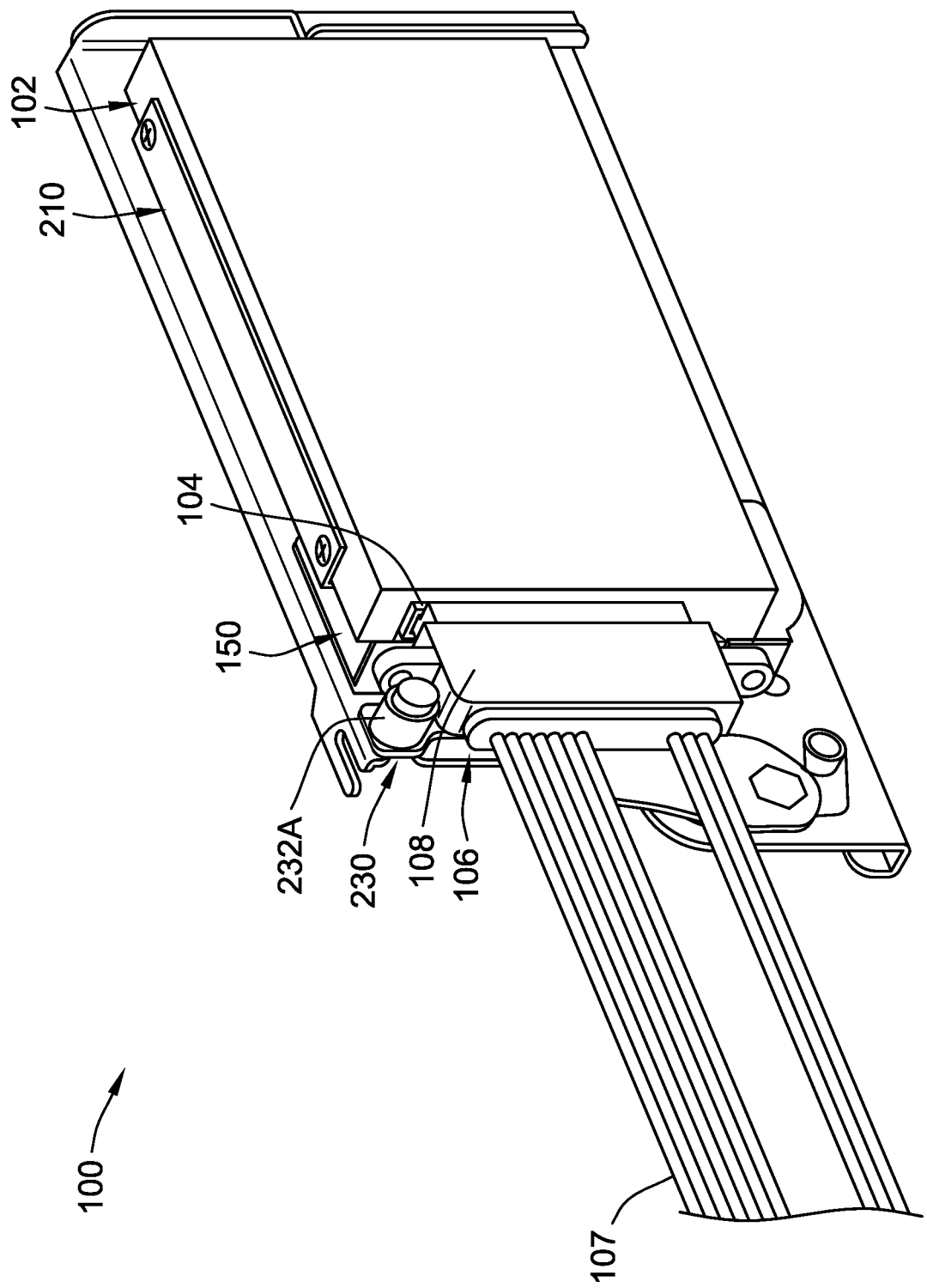
FIG. 8B is a perspective view of the first side of the carrier device of FIG. 8A, according to aspects of the present disclosure.

FIG. 8B is a perspective view of the carrier device 100 after the lever of the carrier device 100 is moved to a final lever position. When the cable holder 150 moves laterally to the final cable holder position, the connector 108 of the cable bundle 106 is inserted into the cable port 104 of the electronic device 102 to electrically connect the one or more cables 107 to the electronic device 102. As shown in FIG. 8B, the first portion 232A of the latch 230 extends away from the slot 124 (FIG. 8A), on the same side of the base bracket 110 as the cable holder 150 and the cable lever 170.

Thus, FIGS. 8A and 8B show the carrier device 100 once the cable holder 150 is moved to the final cable holder position, and the cable lever 170 is moved to the final cable lever position. The cable holder 150 moves to the final cable holder position in response to the cable lever 170 moving to the final cable lever position. In some implementations, the cable lever 170 can be manually moved to the final cable lever position by a user. When the cable holder 150 is in the final cable holder position, the one or more cables 107 of the cable bundle 106 are electrically connected to the electronic device 102.

Figure 9A:
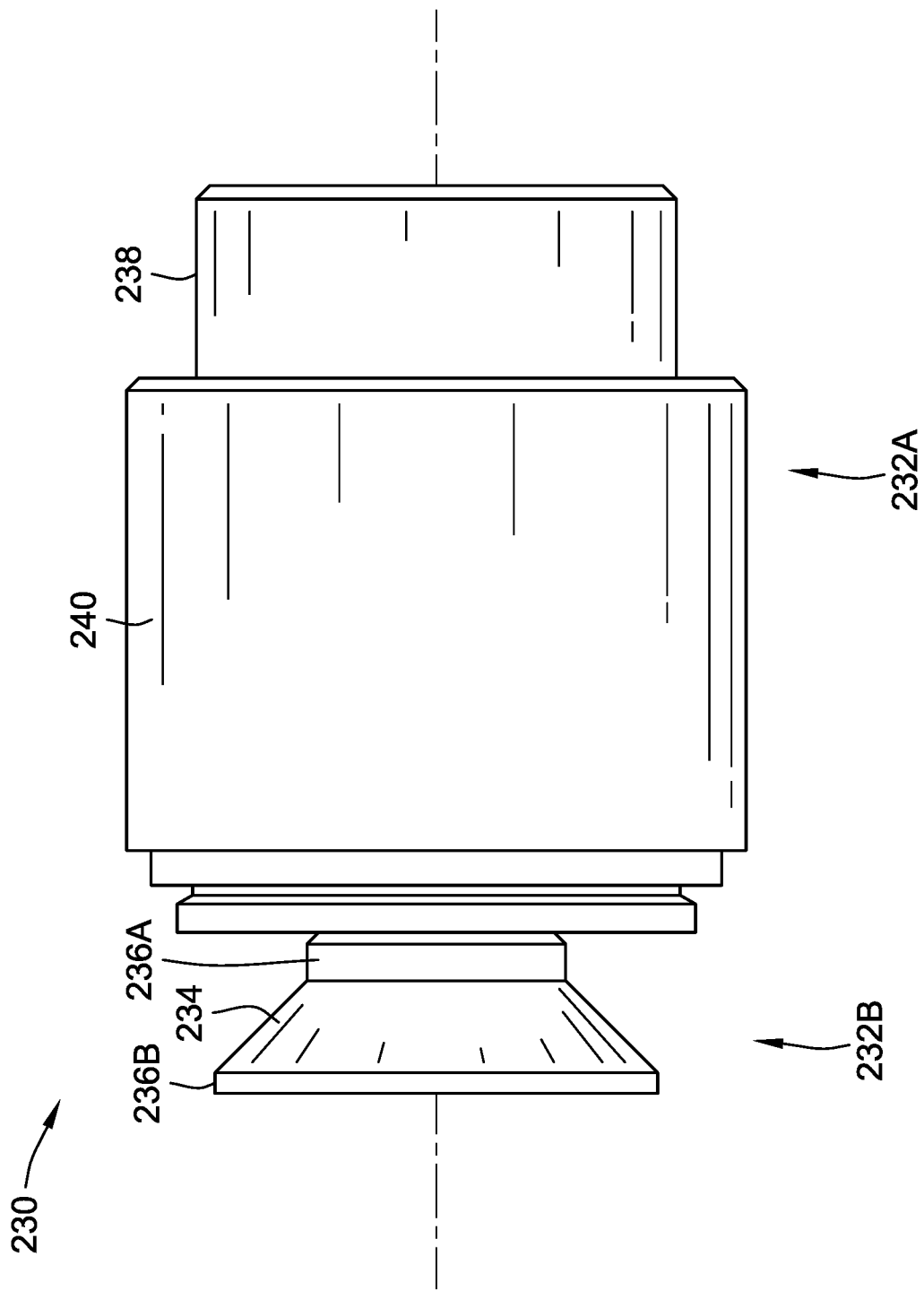
FIG. 9A is a side view of a latch for use with the carrier device of FIG. 1A, according to aspects of the present disclosure.

FIG. 9A shows a side view of the latch 230 from FIGS. 1A-8B. The latch 230 is generally formed from the first portion 232A and the second portion 232B. The latch 230 can be used as an auto-lock latch such that the latch 230 can automatically lock the cable lever 170 in the final cable lever position, once the latch 230 is received in the slot 124 of the base bracket 110 (FIGS. 8A and 8B). The second portion 232B includes a conical-shaped protrusion 234 having a proximal end 236A and a distal end 236B. A diameter of the protrusion 234 increases between the proximal end 236A and the distal end 236B, such that the diameter of the distal end 236B is larger than the diameter of the proximal end 236A.

The first portion 232A includes a button 238 and a button housing 240. The button 238 can be actuated to move the protrusion 234 between an extended position and a retracted position. When the button 238 is pressed toward the button housing 240, the button 238 is received in the button housing 240, and the protrusion 234 moves outward away from the button housing 240 to the extended position. The protrusion 234 is biased toward the retracted position such that when the button 238 is released, the protrusion 234 moves back toward the button housing 240 to the retracted position. As noted herein, in some implementations, the latch 230 may include an internal spring. When the button 238 is pressed to move the protrusion 234 to the extended position, the internal spring can compress. The force exerted by the compressed spring can bias the protrusion 234 back toward the retracted position.

Figure 9B:
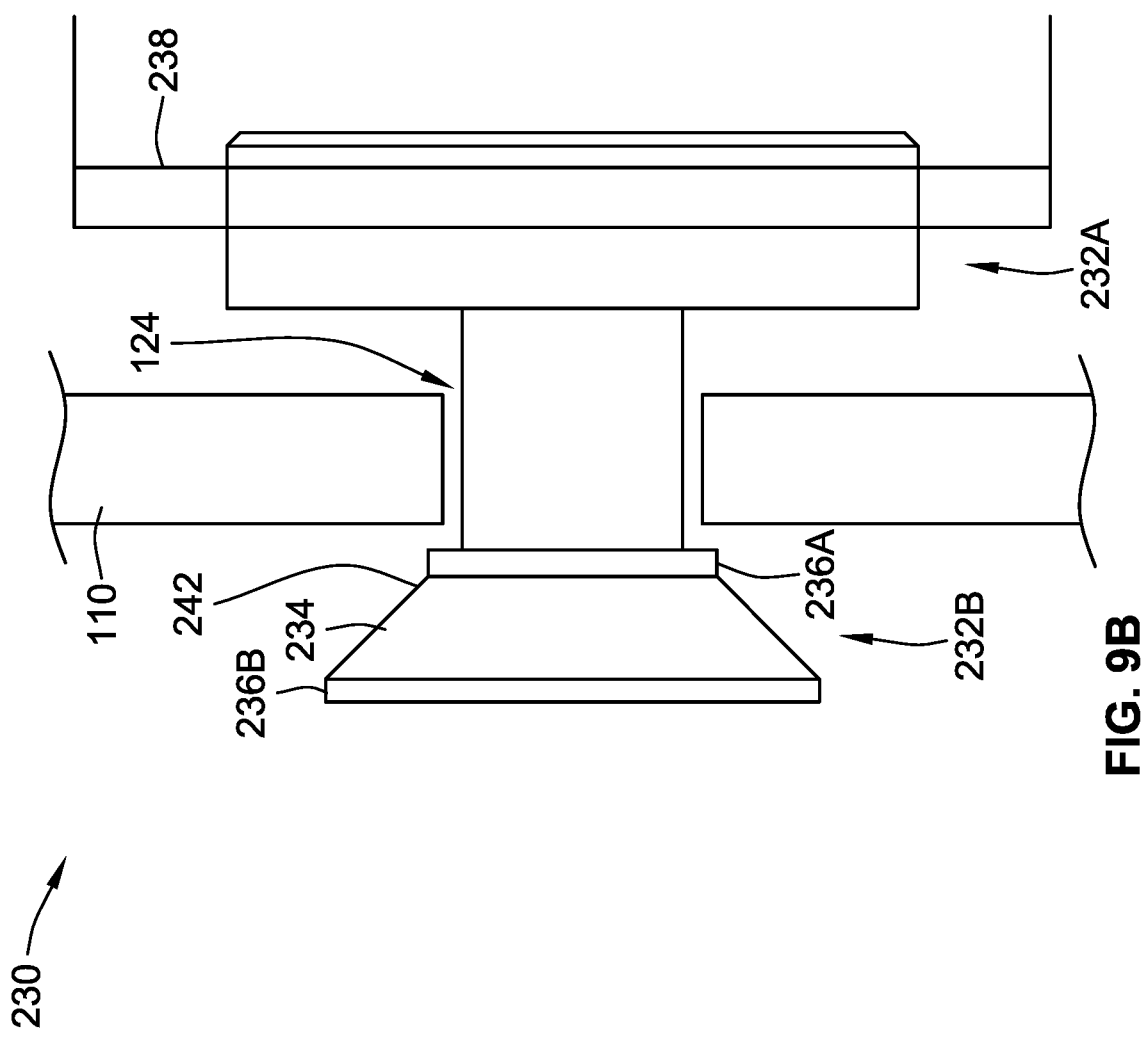
FIG. 9B is a side view of the latch of FIG. 9A inserted into an aperture of the carrier device of FIG. 1A, according to aspects of the present disclosure.

FIG. 9B shows the latch 230 positioned within the slot 124 of the base bracket 110. In the illustrated implementation, the proximal end 236A of the protrusion 234 has a diameter that is less than the width of the slot 124. Thus, the portion of the protrusion 234 that is positioned within the slot 124 has a diameter that is less than the width of the slot 124. A region 242 along the periphery of the protrusion 234 has a diameter that is greater than the width of the slot 124. The region 242 of the protrusion 234 is thus positioned in contact with the portion of the base bracket 110 that forms the edge of the slot 124. In some implementations, the region 242 is located between the proximal end 236A and the distal end 236B. In other implementations, the region 242 may be located at the proximal end 236A, or at the distal end 236B.

Because the protrusion 234 is biased toward the retracted position, and because the diameter of the protrusion 234 from the region 242 back to the distal end 236B is larger than the width of the slot 124, the protrusion 234 cannot retract any further than shown in FIG. 9B. Instead, the bias of the protrusion 234 causes the protrusion 234 to press against the base bracket 110. The force imparted onto the base bracket 110 by the protrusion 234 prevents the latch 230 from inadvertently being removed from the slot 124. To release the latch 230, a user presses the button 238 until the protrusion 234 moves to the expanded position, and the latch 230 can be rotated away from the slot 124.

Figure 10A:
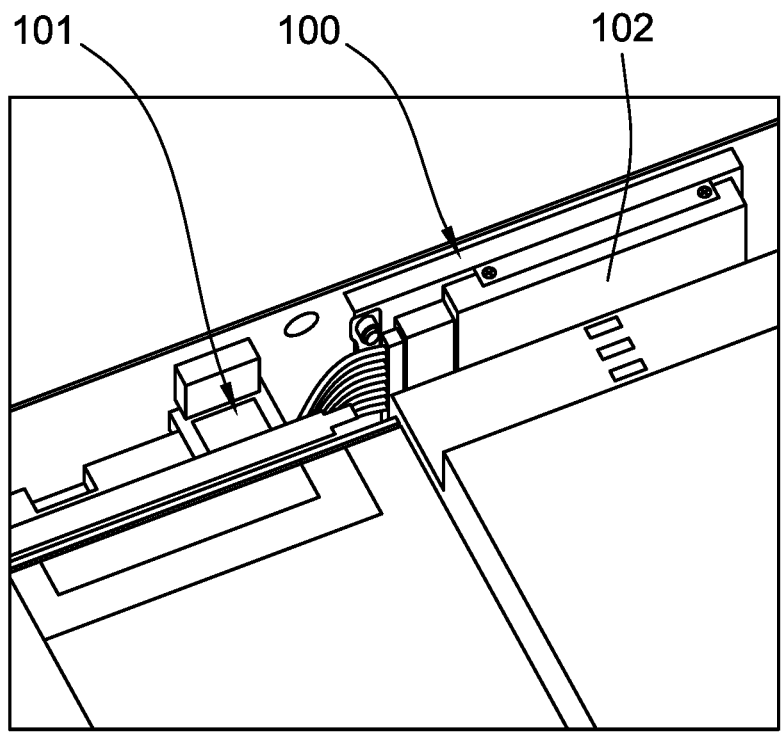
FIG. 10A is a perspective view of a computing system including a computing device, and the carrier device of FIG. 1A inserted into a housing of the computing device in a vertical orientation, according to aspects of the present disclosure.
Figure 10B:
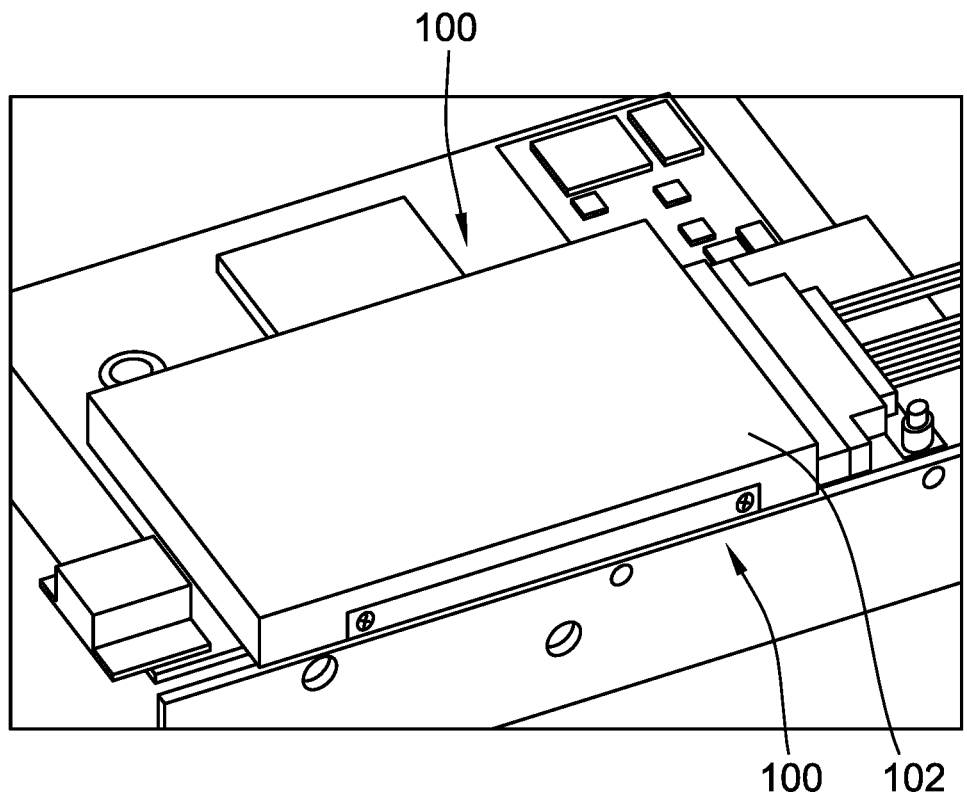
FIG. 10B is a perspective view of a computing system including a computing device, and the carrier device of FIG. 1A inserted into a housing of the computing device in a horizontal orientation, according to aspects of the present disclosure.

FIGS. 10A and 10B show a computing system that includes a housing 101, the carrier device 100, and the electronic device 102. The carrier device 100 and the electronic device 102 are inserted into the housing 101. The housing 101 can be the housing of a server, or any other computing device. In FIG. 10A, the carrier device 100 and the electronic device 102 are positioned in a generally vertical orientation within the housing 101. In FIG. 10B, the carrier device 100 and the electronic device 102 are positioned in a generally horizontal orientation within the housing 101. As long as any required cables can reach the electronic device 102, the carrier device 100 and the electronic device 102 can be positioned in a vertical orientation as in FIG. 10A, a horizontal orientation as in FIG. 10B, or any other suitable orientation.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A carrier device for holding an electronic device within a computing system, the carrier device comprising:
    a base bracket;
    a device bracket configured to receive the electronic device in an initial device bracket position, the device bracket being coupled to the base bracket and movable from the initial device bracket position to a final device bracket position when the electronic device is inserted into the carrier device;
    a lever coupled to the base bracket and movable between an initial lever position and a final lever position, the lever being configured to move from the initial lever position toward the final lever position in response to the device bracket moving from the initial device bracket position to the final device bracket position; and
    a cable holder coupled to the base bracket and to the lever, the cable holder being configured to hold one or more cables, the cable holder being further configured to move from an initial cable holder position to a final cable holder position in response to the lever moving to the final lever position, the one or more cables being electrically connected to the electronic device when the electronic device is inserted into the carrier device and the cable holder is in the final cable holder position.

2. The carrier device of claim 1, wherein when the cable holder is in the initial cable holder position, the one or more cables are not electrically connected to the electronic device.

3. The carrier device of claim 1, wherein the cable holder is slidably coupled to the base bracket, and is configured to slide relative to the base bracket, between the initial cable holder position and the final cable holder position.

4. The carrier device of claim 1, wherein the lever is rotatably coupled to the base bracket, and is configured to rotate relative to the base bracket between the initial lever position and the final lever position.

5. The carrier device of claim 1, wherein the lever is configured to move from the initial lever position to an intermediate lever position in response to the device bracket moving from the initial device bracket position to the final device bracket position.

6. The carrier device of claim 5, wherein the cable holder is configured to remain in the initial cable holder position in response to the lever moving from the initial lever position to the intermediate lever position.

7. The carrier device of claim 6, wherein the cable holder is configured to move from the initial cable holder position to the final cable holder position in response to the lever moving from the intermediate lever position to the final lever position.

8. The carrier device of claim 5, wherein the lever includes a device lever positioned on a first side of the base bracket, and a cable lever positioned on a second side of the base bracket, the cable lever including a protrusion extending through an aperture in the base bracket and contacting the device lever.

9. The carrier device of claim 8, wherein when the lever is in the initial lever position, the device lever is in an initial device lever position, and the cable lever is in an initial cable lever position.

10. The carrier device of claim 9, wherein when the lever is in the intermediate lever position, the device lever is in a final device lever position, and the cable lever is in an intermediate cable lever position.

11. The carrier device of claim 10, wherein when the lever is in the final lever position, the device lever is in the final device lever position, and the cable lever is in a final cable lever position.

12. The carrier device of claim 8, wherein the device bracket includes a protrusion that extends through an aperture in the base bracket and contacts the device lever, and wherein when the device bracket moves to the final device bracket position, the protrusion of the device bracket causes the device lever to move from an initial device lever position to a final device lever position, and the device lever causes the cable lever to move from an initial cable lever position to an intermediate cable lever position.

13. The carrier device of claim 12, wherein the cable lever is configured to be manually moved from the intermediate cable lever position to a final cable lever position by a user, and when the cable lever is moved from the intermediate cable lever position to the final cable lever position, the device lever remains in the final device lever position.

14. The carrier device of claim 13, wherein the cable holder is positioned on the second side of the base bracket and is coupled to the cable lever, and wherein the cable holder is configured to move from the initial cable holder position to the final cable holder position in response to the cable holder lever being moved to the final cable holder lever position.

15. The carrier device of claim 1, wherein the base bracket defines a slot and wherein the lever includes a latch, the slot of the base bracket being configured to receive the latch of the lever in response to the lever being moved to the final lever position, to thereby lock the lever in the final lever position and the cable holder in the final cable holder position.

16. The carrier device of claim 15, wherein the latch includes a protrusion, a diameter of the protrusion increasing between a proximal end of the protrusion and a distal end of the protrusion, the distal end of the protrusion having a diameter greater than a width of the slot, the proximal end of the protrusion having a diameter less than or equal to the width of the slot.

17. The carrier device of claim 16, wherein the protrusion is movable between an extended position and a retracted position, the protrusion being configured to move toward the extended position when received by the slot.

18. The carrier device of claim 17, wherein the protrusion is biased toward the retracted position, such that a region of the protrusion is pressed against the base bracket at an edge of the slot, thereby locking the protrusion in the slot.

19. The carrier device of claim 1, further comprising a stop pin, the stop pin being configured to be received within a corresponding notch defined by the cable holder when the cable holder is moved to the final cable holder position, the stop pin preventing the cable holder from being moved past the final cable holder position.

20. A computing system comprising:
a computing device having a housing;
an electronic device configured to be positioned in the housing of the computing device in a horizontal orientation or a vertical orientation; and
a carrier device configured to be positioned in the housing of the computing device to hold the electronic device, the carrier device including:
a base bracket;
a device bracket configured to receive the electronic device in an initial device bracket position, the device bracket being coupled to the base bracket and movable from the initial device bracket position to a final device bracket position when the electronic device is inserted into the carrier device;
a lever coupled to the base bracket and movable between an initial lever position and a final lever position, the lever being configured to move from the initial lever position toward the final lever position in response to the device bracket moving from the initial device bracket position to the final device bracket position; and
a cable holder coupled to the base bracket and to the lever, the cable holder being configured to hold one or more cables, the cable holder being further configured to move from an initial cable holder position to a final cable holder position in response to the lever moving to the final lever position, the one or more cables being electrically connected to the electronic device when the electronic device is inserted into the carrier device and the cable holder is in the final cable holder position.

* * * * *